US012794432B2

(12) United States Patent
Goff et al.

(10) Patent No.: US 12,794,432 B2
(45) Date of Patent: *Nov. 10, 2026

(54) CUSTOMIZED AUTOMATED AUDIO TUNING

(71) Applicant: Biamp Systems, LLC, Beaverton, OR (US)

(72) Inventors: Eugene Goff, Macedon, NY (US); Ray Dippert, Beaverton, OR (US); Matthew V. Kotvis, Portland, OR (US); Samarth Behura, Hillsboro, OR (US)

(73) Assignee: Biamp Systems, LLC, Beaverton, OR (US)

( * ) Notice: Subject to any disclaimer, the term of this patent is extended or adjusted under 35 U.S.C. 154(b) by 60 days.

This patent is subject to a terminal disclaimer.

(21) Appl. No.: 18/781,331

(22) Filed: Jul. 23, 2024

(65) Prior Publication Data

US 2024/0380373 A1 Nov. 14, 2024

Related U.S. Application Data

(63) Continuation of application No. 18/358,870, filed on Jul. 25, 2023, now Pat. No. 12,081,183, which is a
(Continued)

(51) Int. Cl.
*H04R 29/00* (2006.01)
*G06F 3/16* (2006.01)
(Continued)

(52) U.S. Cl.
CPC ............... *H03G 5/165* (2013.01); *G06F 3/16* (2013.01); *G10L 21/0232* (2013.01);
(Continued)

(58) Field of Classification Search
CPC .................. H04R 29/001; H04R 29/00; H04R 2227/003; H04R 2430/01
See application file for complete search history.

(56) References Cited

U.S. PATENT DOCUMENTS 5,581,621 A 12/1996 Koyama et al.
6,775,385 B1 8/2004 Coombs
(Continued)

FOREIGN PATENT DOCUMENTS

EP 2708040 A1 3/2014

OTHER PUBLICATIONS

Bennett et al., "Simulating Environmental and Psychological Acoustic Factors of the Operating Room," The Journal of the Acoustical Society of America, American Institute of Physics, 2 Huntington Quadrangle, Melville, NY 11747, vol. 138, No. 6 , pp. 3855-3863, XP012204056, ISSN: 0001-4966, DOI: 10.1121 /1.4936947.
(Continued)

*Primary Examiner* — Disler Paul

(57) ABSTRACT

An example method of operation may include identifying, in a particular room environment, a number of speakers and one or more microphones on a network controlled by a controller and amplifier, providing test signals to play sequentially from each amplifier channel of the amplifier and the speakers, monitoring the test signals from the one or more microphones simultaneously to detect operational speakers and amplifier channels, providing additional test signals to the speakers to determine tuning parameters, detecting the additional test signals at the one or more microphones controlled by the controller, and automatically establishing a background noise level and noise spectrum of the room environment based on the detected additional test signals.

20 Claims, 12 Drawing Sheets

Related U.S. Application Data continuation of application No. 17/521,303, filed on Nov. 8, 2021, now Pat. No. 11,711,061.

(60) Provisional application No. 63/139,813, filed on Jan. 21, 2021, provisional application No. 63/139,810, filed on Jan. 21, 2021, provisional application No. 63/139,808, filed on Jan. 21, 2021, provisional application No. 63/139,807, filed on Jan. 21, 2021, provisional application No. 63/139,811, filed on Jan. 21, 2021, provisional application No. 63/139,814, filed on Jan. 21, 2021.

(51) Int. Cl.

| | |
|---|---|
| ***G10L 21/0232*** | (2013.01) |
| ***H03G 5/16*** | (2006.01) |
| ***H04R 1/10*** | (2006.01) |
| ***H04R 1/40*** | (2006.01) |
| ***H04R 3/00*** | (2006.01) |
| ***H04R 3/04*** | (2006.01) |
| ***H04R 3/12*** | (2006.01) |
| ***H04R 5/04*** | (2006.01) |
| ***H04R 27/00*** | (2006.01) |
| ***H04S 7/00*** | (2006.01) |
| *G10L 21/0208* | (2013.01) |
| *G10L 21/0216* | (2013.01) |

(52) U.S. Cl.

CPC ........... *H04R 1/1083* (2013.01); *H04R 1/403* (2013.01); *H04R 1/406* (2013.01); *H04R 3/005* (2013.01); *H04R 3/04* (2013.01); *H04R 3/12* (2013.01); *H04R 5/04* (2013.01); *H04R 27/00* (2013.01); *H04R 29/001* (2013.01); *H04R 29/002* (2013.01); *H04R 29/007* (2013.01); *H04S 7/301* (2013.01); *G10L 2021/02082* (2013.01); *G10L 2021/02166* (2013.01); *H03G 2201/103* (2013.01); *H04R 2227/001* (2013.01); *H04R 2227/003* (2013.01); *H04R 2430/01* (2013.01)

(56) References Cited

U.S. PATENT DOCUMENTS

| | | | | |
|---|---|---|---|---|
| 6,995,385 | B2 | 2/2006 | Tomita et al. | |
| 8,126,156 | B2 | 2/2012 | Corbett et al. | |
| 8,144,882 | B2 | 3/2012 | Christoph et al. | |
| 8,577,048 | B2 | 11/2013 | Chaikin et al. | |
| 8,989,404 | B2 | 3/2015 | De Poortere | |
| 9,118,999 | B2 | 8/2015 | Davis et al. | |
| 9,620,141 | B2 | 4/2017 | Benway et al. | |
| 9,743,212 | B2 | 8/2017 | Ridihalgh et al. | |
| 9,859,858 | B2 * | 1/2018 | Porter | H03G 7/002 |
| 10,019,981 | B1 | 7/2018 | Porter et al. | |
| 10,158,960 | B1 | 12/2018 | Møller | |
| 10,241,667 | B2 * | 3/2019 | Nguyen | G06T 7/55 |
| 10,469,973 | B2 * | 11/2019 | Hayashi | H04R 3/12 |
| 10,524,053 | B1 | 12/2019 | Moore | |
| 10,708,691 | B2 | 7/2020 | Moore | |
| 10,708,702 | B2 | 7/2020 | Yuzuriha et al. | |
| 10,805,755 | B1 | 10/2020 | Tu et al. | |
| 10,893,363 | B2 * | 1/2021 | Choisel | H04R 29/002 |
| 10,904,691 | B2 | 1/2021 | Tu et al. | |
| 10,909,691 | B2 | 2/2021 | Datta et al. | |
| 11,109,173 | B2 | 8/2021 | Po et al. | |
| 11,115,771 | B2 * | 9/2021 | Crutchfield, Jr. | G06F 3/0482 |
| 11,127,413 | B2 | 9/2021 | Karimian Azari et al. | |
| 11,153,685 | B2 * | 10/2021 | Toguri | G10K 15/00 |
| 11,170,771 | B2 | 11/2021 | LaBosco | |
| 11,350,234 | B2 | 5/2022 | Maher et al. | |
| 11,470,433 | B2 | 10/2022 | Gouin | |
| 11,990,881 | B2 | 5/2024 | Goff et al. | |
| 2003/0179891 | A1 | 9/2003 | Rabinowitz et al. | |
| 2006/0262938 | A1 | 11/2006 | Gauger et al. | |
| 2007/0025557 | A1 | 2/2007 | Nackvi et al. | |
| 2007/0147625 | A1 | 6/2007 | Shields et al. | |
| 2007/0192098 | A1 | 8/2007 | Zumsteg et al. | |
| 2007/0253469 | A1 | 11/2007 | Kite | |
| 2008/0172221 | A1 | 7/2008 | Jacoby et al. | |
| 2010/0135118 | A1 | 6/2010 | Van Leest et al. | |
| 2010/0272270 | A1 | 10/2010 | Chaikin et al. | |
| 2010/0290643 | A1 | 11/2010 | Mihelich et al. | |
| 2010/0305725 | A1 | 12/2010 | Brannmark et al. | |
| 2011/0222696 | A1 | 9/2011 | Balachandran et al. | |
| 2012/0215530 | A1 | 8/2012 | Harsch | |
| 2013/0114830 | A1 | 5/2013 | Eastty | |
| 2013/0262103 | A1 | 10/2013 | Reiswig | |
| 2014/0133683 | A1 | 5/2014 | Robinson et al. | |
| 2014/0161281 | A1 | 6/2014 | Nackvi | |
| 2017/0272870 | A1 | 9/2017 | Andersen et al. | |
| 2017/0311077 | A1 | 10/2017 | Nackvi | |
| 2017/0373656 | A1 | 12/2017 | Bharitkar et al. | |
| 2018/0005642 | A1 | 1/2018 | Wang | |
| 2018/0103319 | A1 | 4/2018 | Stein et al. | |
| 2019/0281403 | A1 | 9/2019 | Møller | |
| 2019/0394570 | A1 | 12/2019 | Moore | |
| 2020/0059750 | A1 | 2/2020 | Haurais et al. | |
| 2020/0128345 | A1 | 4/2020 | Calisi et al. | |
| 2020/0286504 | A1 | 9/2020 | Seetharaman et al. | |
| 2020/0329330 | A1 | 10/2020 | Mitchell et al. | |
| 2021/0266667 | A1 | 8/2021 | Zabel et al. | |

OTHER PUBLICATIONS

EESR issued in the EP Patent Application No. 22743192.1, mailed on Jun. 6, 2024.

International Search Report and Written Opinion issued in the International Application No. PCT/US2022/049329, mailed on Feb. 14, 2023.

International Search Report and Written Opinion issued in the International Application No. PCT/US22/49328, mailed on Mar. 3, 2023.

ISR and WO issued in the International Application No. PCT/US22/13185, mailed on Apr. 26, 2022.

Unknown, "Sound System Equipment Part 16: Objective rating of speech intelligibility by speech transmission index", Sep. 25, 2020, https://api.iec.ch/harmonized/publications/download/795590, abstract only.

* cited by examiner

1100

CUSTOMIZED AUTOMATED AUDIO TUNING

TECHNICAL FIELD

This application generally relates to customized alternative automated tuning for a networked audio system.

BACKGROUND

In a workplace, conference area, public forum or other environment, the audio producing speakers and the audio capturing microphones may be arranged in a networked configuration that covers multiple floors, areas and different sized rooms. Tuning the audio at all or most locations has presented a challenge to the manufacturers and design teams of such large-scale audio systems. More advanced tuning efforts, such as combining different test signal strategies and independent speaker signals present further challenges to the setup and configuration processes.

In one example, a test process may initiate a tone via one speaker and a capturing process via one or more microphones, however, the multitude of speakers may not be accurately represented by testing a single speaker signal and identifying the feedback of that speaker when other speakers will be used during an announcement, presentation or other auditory event.

In a typical audio system, such as a conference room, there may be microphones, speakers, telephony integration, input signal processing, output signal processing, acoustic echo cancellation, noise reduction, non-linear processing and mixing of audio signals. Because of the complexity of the corresponding equipment, the installation process and the software configurations, an expert team of persons are required to setup and test and install all the audio equipment.

SUMMARY

One example embodiment may provide a method that includes one or more of identifying a plurality of separate speakers on a network controlled by a controller, providing a first test signal to a first speaker and a second test signal that includes a different frequency than the first test signal to a second speaker, detecting the different test signals at one or more microphones, automatically tuning the speaker output parameters based on an analysis of the different test signals.

Another example embodiment includes a process configured to perform one or more of identifying, in a particular room environment, a plurality of speakers and one or more microphones on a network controlled by a controller and amplifier, providing test signals to play sequentially from each amplifier channel of the amplifier and the plurality of speakers, monitoring the test signals from the one or more microphones simultaneously to detect operational speakers and amplifier channels, providing additional test signals to the plurality of speakers to determine tuning parameters, detecting the additional test signals at the one or more microphones controlled by the controller, and automatically establishing a background noise level and noise spectrum of the room environment based on the detected additional test signals.

Another example embodiment may include an apparatus that includes a processor configured to perform one or more of identify, in a particular room environment, a plurality of speakers and one or more microphones on a network controlled by a controller and amplifier, provide test signals to play sequentially from each amplifier channel of the amplifier and the plurality of speakers, monitor the test signals from the one or more microphones simultaneously to detect operational speakers and amplifier channels, provide additional test signals to the plurality of speakers to determine tuning parameters, detect the additional test signals at the one or more microphones controlled by the controller, and automatically establish a background noise level and noise spectrum of the room environment based on the detected additional test signals.

Yet another example embodiment may include a non-transitory computer readable storage medium configured to store instructions that when executed cause a processor to perform one or more of identifying, in a particular room environment, a plurality of speakers and one or more microphones on a network controlled by a controller and amplifier, providing test signals to play sequentially from each amplifier channel of the amplifier and the plurality of speakers, monitoring the test signals from the one or more microphones simultaneously to detect operational speakers and amplifier channels, providing additional test signals to the plurality of speakers to determine tuning parameters, detecting the additional test signals at the one or more microphones controlled by the controller, and automatically establishing a background noise level and noise spectrum of the room environment based on the detected additional test signals.

Still yet another example embodiment may include a method that includes one or more of identifying a plurality of speakers and microphones connected to a network controlled by a controller, assigning a preliminary output gain to the plurality of speakers used to apply test signals, measuring ambient noise detected from the microphones, recording chirp responses from all microphones simultaneously based on the test signals, deconvolving all chirp responses to determine a corresponding number of impulse responses, and measuring average sound pressure levels (SPLs) of each of the microphones to obtain a SPL level based on an average of the SPLs.

Still yet another example embodiment includes an apparatus that includes a processor configured to identify a plurality of speakers and microphones connected to a network controlled by a controller, assign a preliminary output gain to the plurality of speakers used to apply test signals, measure ambient noise detected from the microphones record chirp responses from all microphones simultaneously based on the test signals, deconvolve all chirp responses to determine a corresponding number of impulse responses, and measure average sound pressure levels (SPLs) of each of the microphones to obtain a SPL level based on an average of the SPLs.

Still yet another example embodiment includes a non-transitory computer readable storage medium configured to store instructions that when executed cause a processor to perform one or more of identifying a plurality of speakers and microphones connected to a network controlled by a controller, assigning a preliminary output gain to the plurality of speakers used to apply test signals, measuring ambient noise detected from the microphones, recording chirp responses from all microphones simultaneously based on the test signals, deconvolving all chirp responses to determine a corresponding number of impulse responses, and measuring average sound pressure levels (SPLs) of each of the microphones to obtain a SPL level based on an average of the SPLs.

Still yet another example embodiment may include a method that includes one or more of determining a frequency response to a measured chirp signal detected from one or more speakers, determining an average value of the frequency response based on a high limit value and a low limit value, subtracting a measured response from a target response, wherein the target response is based on one or more filter frequencies, determining a frequency limited target filter with audible parameters based on the subtraction, and applying an infinite impulse response (IIR) biquad filter based on an area defined by the frequency limited target filter to equalize the frequency response of the one or more speakers.

Still yet another example embodiment includes an apparatus that includes a processor configured to determine a frequency response to a measured chirp signal detected from one or more speakers, determine an average value of the frequency response based on a high limit value and a low limit value, subtract a measured response from a target response, wherein the target response is based on one or more filter frequencies, determine a frequency limited target filter with audible parameters based on the subtraction, and apply an infinite impulse response (IR) biquad filter based on an area defined by the frequency limited target filter to equalize the frequency response of the one or more speakers.

Still yet another example embodiment includes a non-transitory computer readable storage medium configured to store instructions that when executed cause a processor to perform one or more of determining a frequency response to a measured chirp signal detected from one or more speakers, determining an average value of the frequency response based on a high limit value and a low limit value, subtracting a measured response from a target response, wherein the target response is based on one or more filter frequencies, determining a frequency limited target filter with audible parameters based on the subtraction, and applying an infinite impulse response (HIR) biquad filter based on an area defined by the frequency limited target filter to equalize the frequency response of the one or more speakers.

Still yet another example embodiment includes a method that includes one or more of applying a set of initial power and gain parameters for a speaker, playing a stimulus signal via the speaker, determining a sound level at a microphone location and a sound level at a predefined distance from the speakers, determining a gain at the microphone location based on a difference of the sound level at the microphone location and the sound level at the predefined distance from the speaker, and applying the gain to the speaker output.

Still yet another example embodiment includes an apparatus that includes a processor configured to apply a set of initial power and gain parameters for a speaker, play a stimulus signal via the speaker, determine a sound level at a microphone location and a sound level at a predefined distance from the speakers, determine a gain at the microphone location based on a difference of the sound level at the microphone location and the sound level at the predefined distance from the speaker, and apply the gain to the speaker output.

Still yet another example embodiment includes a non-transitory computer readable storage medium configured to store instructions that when executed cause a processor to perform applying a set of initial power and gain parameters for a speaker, playing a stimulus signal via the speaker, determining a sound level at a microphone location and a sound level at a predefined distance from the speakers, determining a gain at the microphone location based on a difference of the sound level at the microphone location and the sound level at the predefined distance from the speaker, and applying the gain to the speaker output.

Still yet another example embodiment includes a method that includes one or more of initiating an automated tuning procedure, detecting via one or more microphones a sound measurement associated with an output of a one or more speakers at two or more locations, determining a number of speech transmission index (STI) values equal to a number of microphones, and averaging the speech transmission index values to identify a single speech transmission index value.

Still yet another example embodiment includes an apparatus that includes a processor configured to initiate an automated tuning procedure, detect via one or more microphones a sound measurement associated with an output of a one or more speakers at two or more locations, determine a number of speech transmission index (STI) values equal to a number of microphones, and average the speech transmission index values to identify a single speech transmission index value.

Still yet another example embodiment includes a non-transitory computer readable storage medium configured to store instructions that when executed cause a processor to perform one or more of initiating an automated tuning procedure, detecting via one or more microphones a sound measurement associated with an output of a one or more speakers at two or more locations, determining a number of speech transmission index (STI) values equal to a number of microphones, and averaging the speech transmission index values to identify a single speech transmission index value.

DETAILED DESCRIPTION

Figure 1:
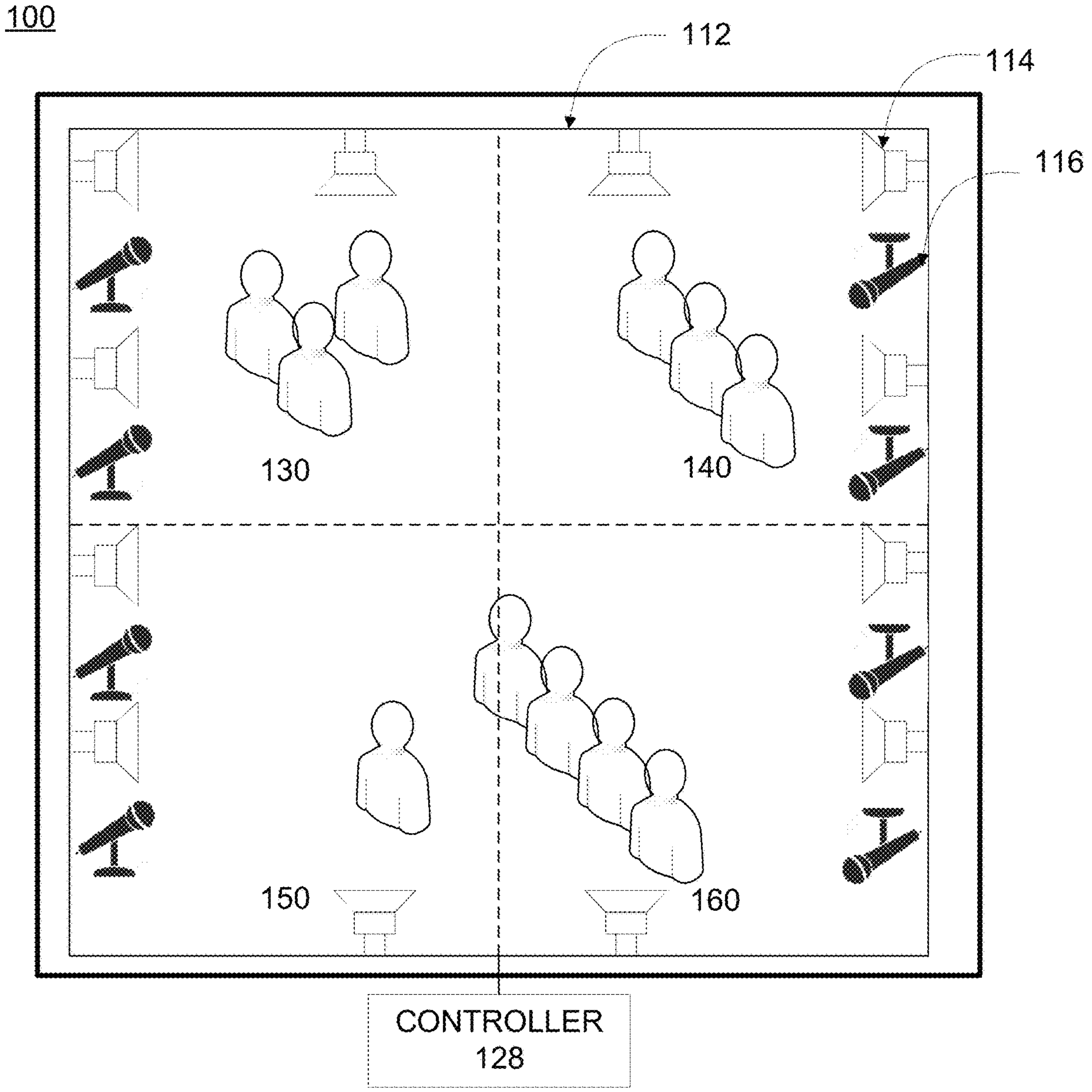
FIG. 1 illustrates a controlled speaker and microphone environment according to example embodiments.

It will be readily understood that the instant components, as generally described and illustrated in the figures herein, may be arranged and designed in a wide variety of different configurations. Thus, the following detailed description of the embodiments of at least one of a method, apparatus, non-transitory computer readable medium and system, as represented in the attached figures, is not intended to limit the scope of the application as claimed, but is merely representative of selected embodiments.

The instant features, structures, or characteristics as described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

In addition, while the term "message" may have been used in the description of embodiments, the application may be applied to many types of network data, such as, packet, frame, datagram, etc. The term "message" also includes packet, frame, datagram, and any equivalents thereof. Furthermore, while certain types of messages and signaling may be depicted in exemplary embodiments they are not limited to a certain type of message, and the application is not limited to a certain type of signaling.

A launch process for establishing an automated tuning and configuration setup for the audio system may include a sequence of operations. In the auto-configuration phase, system firmware may use Ethernet based networking protocols to discover the peripheral devices attached to a central controller device. These peripherals may include beam-tracking microphones, amplifiers, universal serial bus (USB) and Bluetooth (BT) I/O interfaces, and telephony dial-pad devices. Device firmware then modifies its own configuration and the configuration of the discovered peripherals to associate them with one another and to route the associated audio signals through appropriate audio signal processing functions. The auto-tuning phase has three sub-phases, microphone (mic) and speaker detection, tuning, and verification.

Not every amplifier output channel (not shown) managed by a controller device may have an attached speaker. In the microphone and speaker detection phase, a unique detection signal is played sequentially out of each amplifier channel. The input signals detected by all microphones are simultaneously monitored during each detection signal playback. Using this technique, unconnected amplifier output channels are identified, and the integrity of each microphone input signal is verified. During the tuning phase, other unique test signals are played sequentially out of each connected amplifier output channel. These signals are again monitored simultaneously by all microphones. Having prior knowledge of the microphones' frequency response(s), and using various audio processing techniques, the firmware can calculate the background noise level and noise spectrum of the room, sensitivity (generated room SPL for a given signal level) of each amplifier channel and connected speaker, a frequency response of each speaker, a distance from each microphone to each speaker, room reverberation time (RT60), etc. Using these calculations, the firmware is able to calculate tuning parameters to optimize per-speaker channel level settings to achieve the given target SPL, per-speaker channel EQ settings to both normalize the speaker's frequency response and achieve the target room frequency response. Acoustic echo cancellation (AEC), noise reduction (NR) and non-linear processing (NLP) settings which are most appropriate and effectual for the room environment.

The verification phase occurs after the application of the tuning parameters. During this phase the test signals are again played sequentially out each connected amplifier output channel and monitored simultaneously by all microphones. The measurements are used to verify the system achieves the target SPL and the system achieves the target room frequency response. During the verification phase a specially designed speech intelligibility test signal is played out all speakers and monitored by all microphones simultaneously. Speech intelligibility is an industry standard measure of the degree to which sounds can be correctly identified and understood by listeners. Most of the measurements taken and settings applied by auto-setup are provided in an informative report for download from the device.

Example embodiments provide a system that includes a controller or central computer system to manage a plurality of microphones and speakers to provide audio optimization tuning management in a particular environment (e.g., workplace environment, conference room, conference hall, multiple rooms, multiple rooms on different floors, etc.). Automated tuning of the audio system includes tuning various sound levels, performing equalization, identifying a target sound pressure level (SPL), determining whether compression is necessary, measuring speech intelligibility, determining optimal gain approximations to apply to the speakers/microphones, etc. The environment may include multiple microphones and speaker zones with various speakers separated by varying distances. Third party testing equipment is not ideal and does not provide simplified scalability. Ideally, identifying the network components active on the network and using only those components to setup an optimized audio platform for conferencing or other presentation purposes would be optimal for time, expertise and expense purposes.

An automated equalization process may be capable of automatically equalizing the frequency response of any loudspeaker in any room to any desired response shape which can be defined by a flat line and/or parametric curves. The process may not operate in real-time during an active program audio event, but rather during a system setup procedure. The process considers and equalizes the log magnitude frequency response (decibels vs. frequency) and may not attempt to equalize phase. The process may identify optimal filters having a frequency response that closely matches the inverse of the measured response in order to flatten the curve, or reshape the curve to some other desired response value. The process may use single-biquad infinite impulse response (IR) filters which are bell-shaped to boost or cut a parametric filter, low-pass, and/or high-pass filter. FIR filters could also be used, but IIR filters have optimized computational efficiency and low-frequency resolution, and are better suited for spatial averaging, or equalizing over a broad listening area in a room.

When performing the equalization process, a desired target frequency response is identified. Typically, this would be a flat response with a low frequency roll-off and high frequency roll-off to avoid designing a filter set which would be attempting to achieve an unachievable result from a frequency-limited loudspeaker(s). The target mid-band response does not have to be flat, and the process permits any arbitrary target frequency response in the form of an array of biquad filters. The process also permits a user to set a maximum dB boost or certain cut limits on the total DSP filter set to be applied prior to any automated tuning process.

FIG. 1 illustrates a controlled speaker and microphone environment according to example embodiments. Referring to FIG. 1, the illustration demonstrates an audio-controlled environment 112 which may have any number of speakers 114 and microphones 116 to detect audio, play audio, replay audio, adjust audio output levels, etc., via an automated tuning procedure. The configuration 100 may include various different areas 130-160 separated by space, walls and/or floors. The controller 128 may be in communication with all the audio elements and may include a computer, a processor, a software application setup to receive and produce audio, etc. In this example, a chirp response measurement technique may be used to acquire a frequency response by measurement of a loudspeaker.

With regard to a setup process, a launch option (auto setup+auto tuning) on the front of a user interface of a user device in communication with the controller 128 may provide a way to test the sound profile of the room(s), the speaker(s) and microphone(s). Network discovery can be used to find devices plugged-in and included in a list of system devices and provide them with a baseline configuration to initiate during operation. The audio system may be realized in a graphical format during a device discovery process, the operator can then drag and drop data for a more customizable experience or reset to a factory default level. If the system did not adequately tune to a certain level, then an alert can be generated and any miswirings can be discovered as well by a testing signal sent to all known devices.

The audio environments normally include various components and devices such as microphones, amplifiers, loudspeakers, DSP devices, etc. After installation, the devices need to be configured to act as an integrated system. The software application may be used to configure certain functions performed by each device. The controller or central computing device may store a configuration file which can be updated during the installation process to include a newly discovered audio profile.

One approach to performing the automated tuning process may include permitting the auto-tune processes to operate on a device that also contains custom DSP processing. To enable this combined feature, the code would discover the appropriate signal injection and monitoring points within the custom configuration. With the injection and monitoring points identified, any selected DSP processing layout would be automatically compatible. Some operations in the auto-tune process will send test signals out of each speaker one at a time, which increases total measurement time when many speakers are present. Other operations may include sending test signals out of all speakers in a simultaneous or overlapping time period and performing testing processes on the aggregated sound received and processed.

To reduce a total measurement time, different signals may be played out of each speaker simultaneously. Some different ways to offer mixed signals may include generating one specific sine wave per speaker where a unique frequency is used for each different speaker, playing a short musical composition where each speaker plays a unique instrument in the mix of a music composition, or just tones which are different in frequency can be paired with each speaker, respectively. With a large number of speakers, a song with a large variety of percussion instruments could be used, with one drum sound per speaker. Any other multichannel sound mixture could be used to drive the process of dynamic and/or customized sound testing. There are other sound event detection algorithms that are capable of detecting the presence of a sound in a mixture of many other sounds that could be useful with this testing analysis procedure. The auto-tune could be a combination of voice prompts and test signals played out of each speaker. The test signals are used to gather information about the amplifiers, speakers, and microphones in the system, as well as placement of those devices in an acoustic space.

There are other signals that could be used to collect the same room and equipment information gathered for testing. The decision to use different signals could be based on different goals, such as signals used which are pleasant sounding, which may include voice and/or music prompts. The upside is the elimination of scientific-sounding test tones being played into the space. The potential downside is additional time required to extract room and equipment information from less-than-ideal source signals. To reduce the total measurement time, the voice prompts could be eliminated and basic test signals could be used which produce the fastest results.

An auto equalization procedure (see FIG. 3) is capable of automatically equalizing the frequency response of any loudspeaker in any room to any desired response shape which can be defined by a flat line and/or parametric curves. The procedure may not be real-time during an active program audio event, but rather during a system setup procedure. The procedure equalizes the log magnitude frequency response (decibels versus frequency) and may not equalize phase. The procedure identifies a set of optimal filters having a frequency response that closely matches the inverse of the measured response to flatten or reshape the response to some other desired response value. The procedure uses single-biquad IIR filters which are a bell type (e.g., boost or cut parametric filter), low-pass, or high-pass. FIR filters could be used, but IIR filters have a more optimal computational efficiency, low-frequency resolution, and are better suited for spatial averaging and/or equalizing over a broad listening area in a room.

When performing the equalization process, first a desired target frequency response is identified. Typically, this would be a flat response with a low frequency roll-off and high frequency roll-off to avoid the process from designing a filter set which would be attempting to achieve an unachievable result from a frequency-limited loudspeaker. The target mid-band response does not have to be flat, and the procedure permits any arbitrary target frequency response in the form of an array of bi-quad filters. The procedure also permits the user to set a maximum dB boost or to cut limits on the total DSP filter set to be applied.

One example procedure associated with an auto-setup procedure (see FIG. 2), may provide sequencing through each speaker output channel and perform the following operations for each output: ramping-up a multitone signal until the desired SPL level is detected, determining if speaker output channel is working normally, determining if all microphone (mic) input channels are working normally, setting preliminary output gain for unknown amp and speaker for test signals, measuring ambient noise from all mics to set base for an RT60 measurement, which is a measure of how long sound takes to decay by 60 dB in a space that has a diffuse sound-field, and checking for excessive noise, providing a chirp test signal, recording chirp responses from all 'N' mics simultaneously into an array, deconvolving all chirps from 'N' mics giving 'N' impulse responses, and for each mic input: locating a main impulse peak and computing a distance from speaker to mic, computing a smoothed log magnitude frequency response and applying mic compensation value (using known mic sensitivity), computing a SPL average over all frequencies, averaging frequency response of all mics to obtain a spatial average, performing auto-equalization on the spatial averaged response to match a target response, the SPL level and distance from nearest and furthest mics is used to compute room attenuation, using the SPL level from a nearest mic and room attenuation to compute output gain to achieve desired level at an average distance from all mics, calculating a SPL limiter threshold, with auto EQ and auto gain engaged, producing a chirp to measure and verify the response, measuring octave-band RT60 for each mic, and measuring an average SPL from each mic, then averaging all mics to obtain achieved SPL level.

Another example embodiment may include an auto-setup procedure that includes determining which input mics are working and which output speaker channels are working, performing an auto equalization of each output speaker channel to any desired target frequency response (defined by parametric EQ parameters), auto-setting each output path gain to achieve a target SPL level in the center of the room determined by average distance from speaker to microphones, auto-setting of output limiters for maximum SPL level in the center of the room, auto-setting of auto-echo cancellation (AEC), non-linear processing (NLP) and noise reduction (NR) values based on room measurements, measuring a frequency response of each output speaker channel in the room, measuring a final nominal SPL level expected in the center of the room from each output channel, measuring an octave-band and full-band reverberation time of the room, measuring of noise spectrum and octave-band noise for each microphone, measuring of the noise criteria (NC) rating of the room, and measuring of the minimum, maximum, and average distance of all mics from the speakers, and the speech intelligibility of the room. All the measurement data may be used to establish the optimal speaker and microphone configuration values.

In one example audio system setup procedure, a launch operation (i.e., auto setup+auto tuning) on a user interface may provide a way to initiate the testing of the sound profile of the room, speakers and microphones. Network discovery can be used to find devices plugged-in and to be included in a list of system devices and provide them with baseline configurations to initiate during an audio use scenario. The audio system may be realized in a graphical format during a device discovery process, the operator can interface with a display and drag and drop data for a more customizable experience or reset to a factory default level before or after an automated system configuration. If the system did not adequately tune to a certain level, then an alert can be generated and any miswirings can be discovered as well by a testing signal sent to all known devices.

The audio environments normally include various components and devices, such as microphones, amplifiers, loudspeakers, digital signal processing (DSP) devices, etc. After installation, the devices need to be configured to act as an integrated system. The software of the application may be used to configure certain functions performed by each device. The controller or central computing device may store a configuration file which can be updated during the installation process to include a newly discovered audio profile based on the current hardware installed, an audio environment profile(s) and/or a desired configuration. In one example embodiment, an automated tuning procedure may tune the audio system including all accessible hardware managed by a central network controller. The audio input/output levels, equalization and sound pressure level (SPL)/compression values may all be selected for optimal performance in a particular environment.

During automated setup, a determination of which input mics are working, and which output speaker channels are working is performed. The auto-equalization of each output speaker channel is performed to a desired target frequency response (defined by parametric EQ parameters, high pass filters, low pass filters, etc.). A default option may be a "flat" response. Additional operations may include an automated setting of each output path gain to achieve a user's target SPL level in the center on the room assuming an average distance of mics, and an auto setting of output limiters for a user's maximum SPL level in the center of the room. Another feature may include automatically determining auto-echo cancellation (AEC), non-linear processing (NLP) and NRD values based on room measurements. The following informative measurements which may also be performed include a measurement of frequency response of each output speaker channel in the room, a measurement of a final nominal SPL level expected in the center of the room from each output channel, a measurement of octave-band reverberation time (RT-60) of the room, and a measurement of a noise floor in the room. Additional features may include a measurement of the minimum, maximum, and average distance of all mics from the speakers. Those values may provide the information necessary to perform additional automatic settings, such as setting a beamtracking microphone's high-pass filter cutoff frequency based upon the reverberation time in the lower bands of the room, and fine tuning AEC's adaptive filter profile to best match the expected echo characteristics of the room. The information obtained can be saved in memory and used by an application to provide examples of the acoustic features and sound quality characteristics of a conference room. Certain recommendations may be used based on the room audio characteristics to increase spacing between mics and loudspeakers, or, to acoustically adjust a room via the speakers and microphones due to excessive RT-60 (reverberance "score" for predicted speech intelligibility)

The audio setup process may include a set of operations, such as pausing any type of conferencing audio layout capability and providing the input (microphone) and output (loudspeaker) control to the auto setup application. Sequentially, each output loudspeaker which participates in the auto-setup will produce a series of "chirps" and/or tones designed to capture the acoustic characteristics of the room. The number of sounds produced in the room is directly related to the number of inputs and outputs which participate in the auto-setup process. For example, in a system with three microphones and two loudspeakers, auto-setup would perform the following actions: (- - - First Loud speaker - - - ), loudspeaker 1 produces a series of sounds which are captured by mic 1, loudspeaker 1 produces a series of sounds which are captured by mic 2, and loudspeaker 1 produces a series of sounds which are captured by mic 3; (- - - Next Loudspeaker - - - ), loudspeaker 2 produces a series of sounds which are captured by mic 1, loudspeaker 2 produces a series of sounds which are captured by mic 2, loudspeaker 2 produces a series of sounds which are captured by mic 3, and after this process completes, the regular conferencing layout audio processing is restored. The gain and equalization for each loudspeaker is adjusted based on auto setup processing, AEC performance is tuned for the room based on auto setup processing, microphone LPF is tuned for the room based on the auto setup processing, and the acoustic characteristics of the room have been logged. Optionally, the user is presented with some summarizing data describing the results of the auto setup process. It is possible that the auto setup may "fail" while processing, if a defective microphone or loudspeaker is discovered, or if unexpected loud sounds (e.g., street noise) is captured while the processes is underway. Auto setup will then halt, and the end user will be alerted if this is the case. Also, a friendly auto setup voice may be used to discuss with the user what auto setup is doing as it works through the process.

Figure 2:
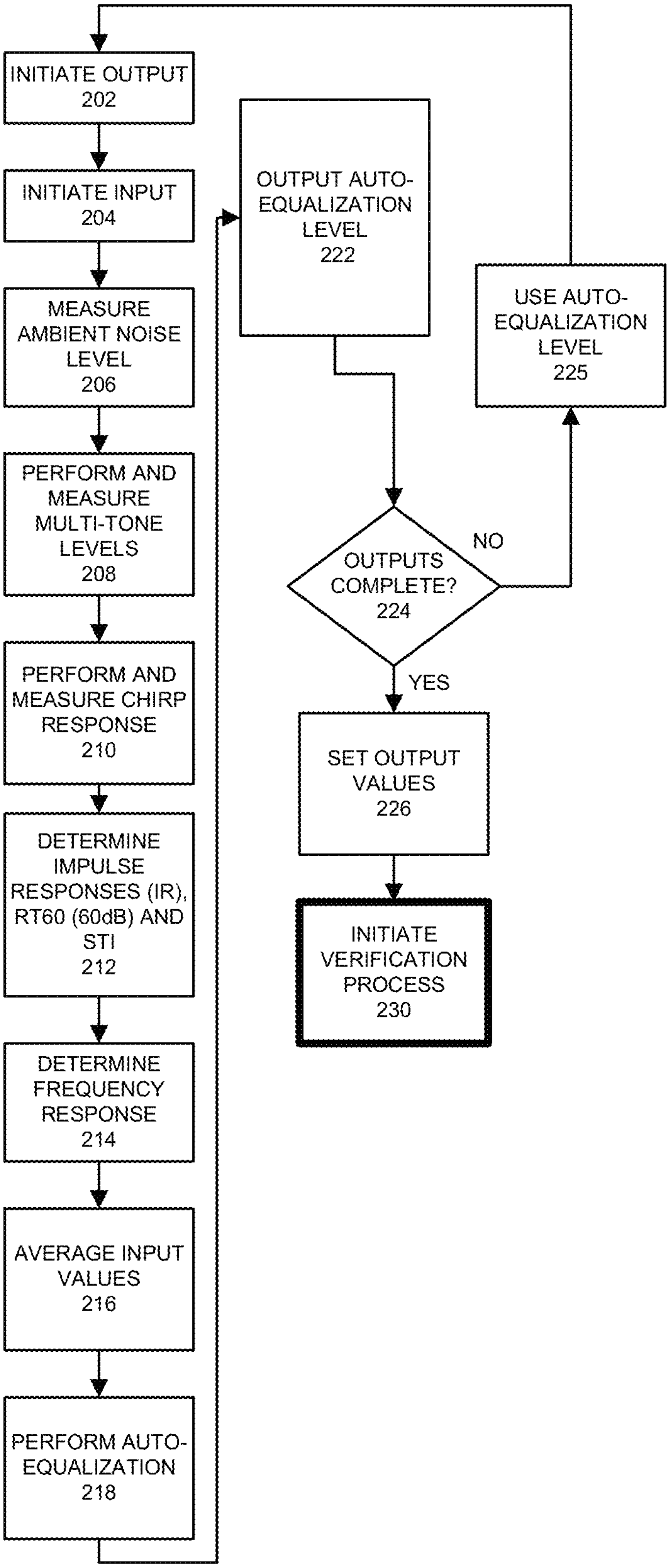
FIG. 2 illustrates a process for performing an automatic tuning procedure in the controlled speaker and microphone environment according to example embodiments.

FIG. 2 illustrates an automated equalization process, which includes an iterative process for multiple speakers in the environment. Referring to FIG. 2, during a boot-up procedure, a user interface may be used to control the initiation and "auto-tune" option. A memory allocation operation may be performed to detect certain speakers, microphones, etc. The identified network elements may be stored in memory. A tune procedure may also be performed which causes the operations of FIG. 2 to initiate. Each speaker may receive an output signal 202 that is input 204 to produce a sound or signal. An ambient noise level may be identified 206 as well from the speakers and detected by the microphones. Multiple tones may be sent to the various speakers 208 which are measured and the values stored in memory. Also, a chirp response 210 may be used to determine the levels of the speakers and the corresponding room/environment. The impulse responses 212 may be identified and corresponding frequency response values may be calculated 214 based on the inputs. Also, the speech intelligibility rating may be calculated (speech transmission index (STI)) along with the 'RT60' value which is a measure of how long sound takes to decay by 60 dB in a space that has a diffuse sound-field, meaning a room large enough that reflections from the source reach the mic from all directions at the same level. An average of the input values 216 may be determined to estimate an overall sound value of the corresponding network elements. The averaging may include summing the values of the input values and dividing by the number of input values.

Continuing with the same example, an auto-equalization may be performed 218 based on the spatial average of the input responses. The auto-equalization levels may be output 222 until the procedure is completed 224. When the outputs are completed 224, the output values are set 226 which may include the parameters used when outputting audio signals to the various speakers. The process continues iteratively during a verification procedure 230, which may include similar operations, such as 202, 204, 210, 212, 214, 216, for each speaker. Also, in the iterative verification process, a measure of speech intelligibility may be performed until all the output values are identified. If the outputs are not complete in operation 224, the auto-equalization level 225 is used to continue on with the next output value (i.e., iteratively) of the next speaker and continuing until all speaker outputs are measured and stored.

The auto-setup operations rely on measurements of loudspeakers, microphones, and room parameters using chirp signals and possible chirp deconvolution to obtain the impulse response. Chirp signal deconvolution may be used acquire quality impulse responses (IRs), which are free of noise, system distortion, and surface reflections, using practical FFT sizes. One item which will affect the effectiveness of the auto-setup procedure is how much is known about system components such as microphones, power amps, and loudspeakers. Whenever component frequency responses are known, corrective equalization should be applied by the digital signal processor (DSP) prior to generating and recording any chirp signals in order to increase the accuracy of the chirp measurements.

An auto-equalization procedure may be used to equalize the frequency response values of any loudspeaker in any room to a desired response shape (e.g., flat line and/or parametric curves). Such a procedure may utilize single-biquad IIR filters of a bell shape type. The process may begin with a desired target frequency response with a low frequency roll-off and a high frequency roll-off to avoid encountering limitations on filters established for a particular loudspeaker and room. A target response ($H_{target}$) may be flat with a low frequency roll-off. Using the chirp stimulus/response measurement, the measured frequency response of a loudspeaker in a room may be obtained. The response needs to be normalized to have an average of 0 dB, high and low frequency limits may be used to equalize and set limits for the data utilized. The procedure will compute the average level between the limits and subtract this average level value from the measure response to provide a response normalized at '0' ($H_{meas}$). The frequency-limited target filter is then determined by subtracting the measured response from the target response: $H_{targfilt}=H_{target}-H_{meas}$ and this value is the target response used for the next auto EQ biquad filter.

To find parametric filters to fit the curve for the $H_{targfilt}$, all the important curve features (0 dB crossing points and peak points) are found by a function called FindFreqFeatures( ).

The filter choice at two frequency limits is handled slightly different. If the target filter calls for a boost at the frequency limit, then a PEQ boost filter will be used with its center frequency at the limit frequency. If the target filter calls for an attenuation at the frequency limit, which typically happens when the target response has a roll-off, then a HPF/LPF is selected and a −3 dB corner frequency is computed to match to point where the curve is −3 dB. This was found to produce a better match when traversing outside of the auto EQ range, particularly when roll-off responses are desired which will most often be the case. Once all the frequency features of the target filter have been identified, a function called FindBiggestArea( ) is used to find the most salient biquad filter for the target which is characterized simply by the largest area under the target filter curve as shown below.

Based on the characteristics, a function called DeriveFiltParamsFromFreqFeatures( ) computes the 3 parameters (fctr, dB, Q) based on the curve center frequency, dB boost/cut, and the bandwidth (Q). Bandwidth for a 2-pole bandbass filter is defined as fctr/($f_{upper}-f_{lower}$) where $f_{upper}$ and $f_{lower}$ are where the linear amplitude is 0.707*peak. Here there are bell filters which are 1+bandpass, but empirically it was found that using 0.707*peak(dB), where the baseline is 0 dB, also provided optimal results for estimating the Q of the bell shape. The edge frequencies are not used to calculate the PEQ bandwidths, but rather are used to delineate two adjacent PEQ peaks. If the area represents an attenuation at a frequency limit, then the function will compute a LPF/HPF filter corner frequency where the response is −3 dB. From these filter parameters, the auto EQ biquad filter coefficients are computed and the biquad is added to the auto EQ DSP filter set. This updated DSP filter response ($H_{dspfilt}$) is then added to the measured response ($H_{meas}$) {all quantities in dB} to show what the auto-equalized response would look like ($H_{autoeq}$). The auto-equalized response ($H_{autoeq}$) is then subtracted from the target response ($H_{target}$) to produce a new target filter ($H_{target}$). This new target filter represents the error, or difference between the desired target response and the corrected response.

Figure 3:
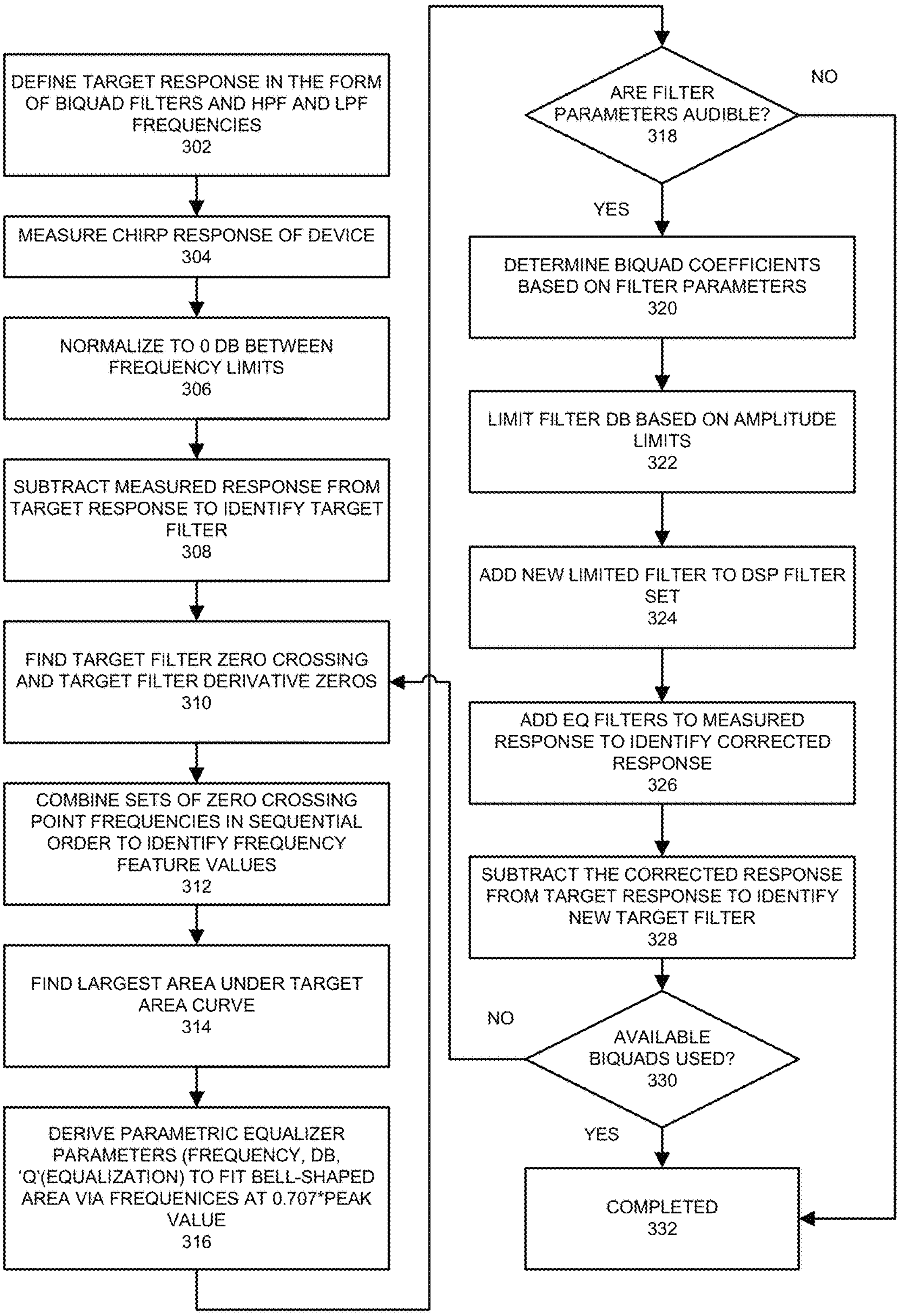
FIG. 3 illustrates a process for performing an automated equalization process in the controlled speaker and microphone environment according to example embodiments.

FIG. 3 illustrates a process for determining an automated equalization filter set to apply to a loudspeaker environment according to example embodiments. Referring to FIG. 3, the process may include defining a target response as a list of biquad filters and HPF/LPF frequencies 302, measuring a chirp response from a microphone 304, normalizing the value to 0 dB between the frequency limits 306, subtracting a measured response from a target response to provide a target filter 308, finding a target filter zero crossings and derivative zeros 310, combining the two sets of zero frequencies in a sequential order to identify frequency feature values 312, identifying a largest area under the target filter curve 314, deriving parameters to fit a bell shaped area for frequencies at 0.707 multiplied by a peak value 316, determining whether the filter parameters are audible 318, if so, the process continues with calculating the biquad coefficients based on the identified filter parameters 320. The process continues with limiting the filter dB based on amplitude limits 322, adding this new limited filter to a DSP filter set 324, adding the unlimited EQ filters to a measured response to provide an unlimited corrected response 326, and subtracting this corrected response from the target response to provide a new target filter 328. If all available biquads are used 330 then the process ends 322, or if not, the process continues back to operation 310.

In order to determine which loudspeaker (speaker) outputs are live, a five-octave multitone (five sinewave signals spaced one octave apart) signal level is applied to the speakers and ramped-up at a rapid rate for quick detection of any connected live speaker. The multitone signal level is ramped-up one speaker at a time while the signal level from all microphones is monitored. As soon as one microphone (mic) receives the signal at the desired audio system sound pressure level (SPL) target level (i.e., SPL threshold level), then the multitone test signal is terminated and the speaker output channel is designated as being live. If the multitone test signal reaches a maximum 'safe limit' and no mics have received the target SPL level, then the speaker output is designated as dead/disconnected. The received five-octave signal is passed through a set of five narrow bandpass filters. The purpose of the five octave test tones and five bandpass filters is to prevent false speaker detection from either broadband ambient noise, or a single tone produced from some other source in the room. In other words, the audio system is producing and receiving a specific signal signature to discriminate this signal from other extraneous sound sources in the room. The same five-octave multitone used to detect live speaker outputs is simultaneously used to detect live microphone inputs. As soon as the highest mic signal reaches the audio system target SPL level, then the multitone test signal is terminated. At that instant, all mic signal levels are recorded. If a mic signal is above some minimum threshold level, then the mic input is designated as being a live mic input, otherwise it is designated as being dead/disconnected.

In order to set loudspeaker output gain levels, a desired acoustic listening level in dBs for the SPL will be determined and stored in firmware. The DSP loudspeaker output channels will have their gains set to achieve this target SPL level. If the power amplifier gains are known, and the loudspeaker sensitivities are known, then these output DSP gains can be set accurately for a particular SPL level, based on, for example, one meter from each loudspeaker (other distances are contemplated and may be used as alternatives). The level at certain estimated listener locations will then be some level less than this estimated level. In free space, sound level drops by 6 dB per doubling of distance from the source. For typical conference rooms, the level versus doubling of distance from a source may be identified as −3 dB. If it is assumed each listener will be in the range of 2 meters to 8 meters from the nearest loudspeaker, and the gains are set for the middle distance of 4 meters, then the resulting acoustic levels will be within +/−3 dB of the desired level. If the sensitivity of the loudspeaker(s) are not known, then the chirp response signal obtained from the nearest microphone will be used. The reason for the nearest microphone is to minimize reflections and error due to estimated level loss versus distance. From the level and time-of-flight (TOF) of this response, the loudspeaker sensitivity can be estimated, although the attenuation due to loudspeaker off-axis pickup is not known. If the power amp gain is not known, then a typical value of 29 dB will be used which may introduce an SPL level error of +/−3 dB.

Analyzing electro-acoustic sound systems to identify gains that should be used to achieve optimal acoustic levels. Voltage, power and acoustic levels and gains can be derived from any sound system. Those values can be used to provide a SPL level at some specific location using a DSP processor. In general, an audio system will have a microphone, loudspeaker, a codec, a DSP processor and an amplifier.

Figure 4:
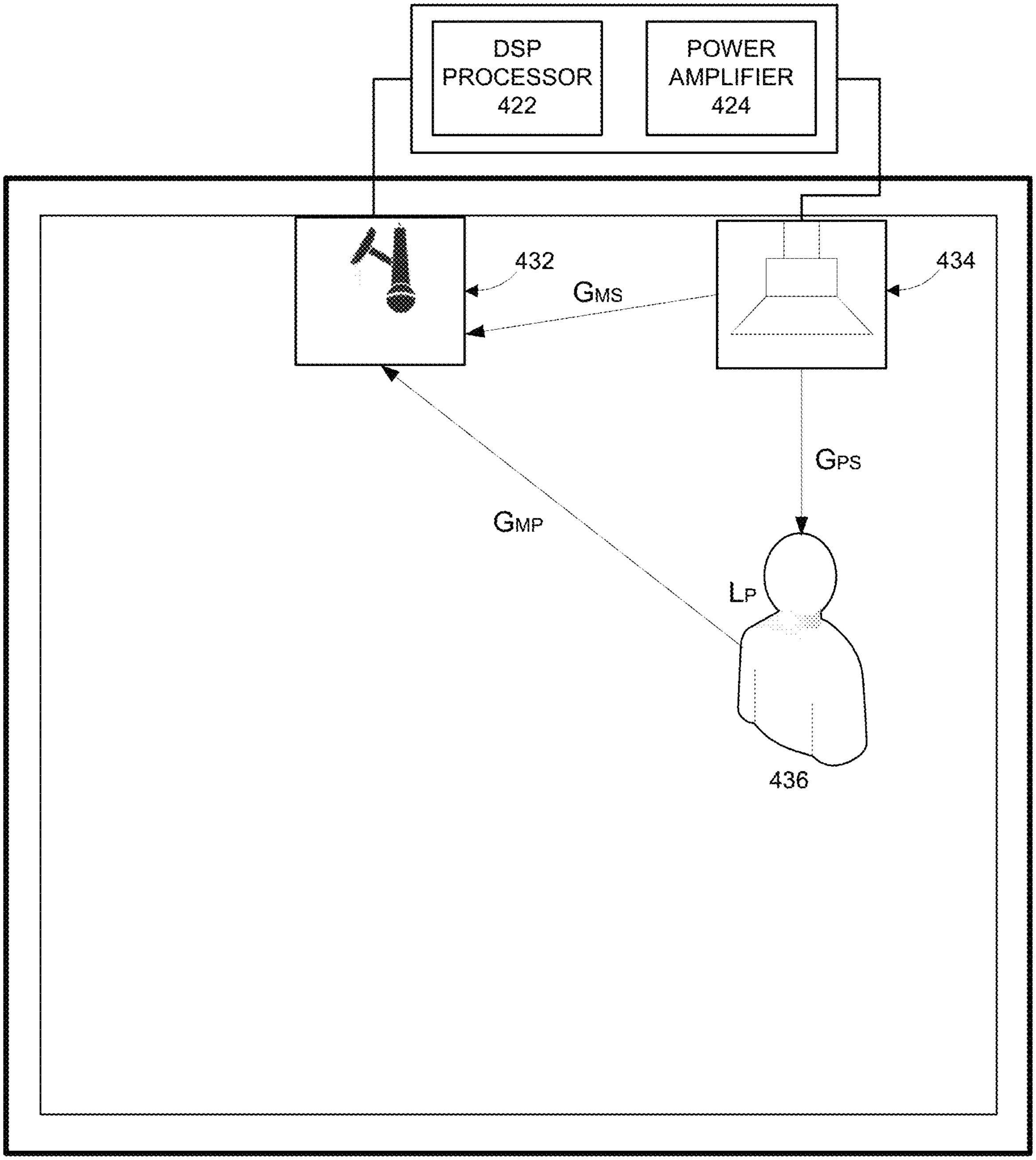
FIG. 4 illustrates an audio configuration used to identify a level of gain in the controlled speaker and microphone environment according to example embodiments.

FIG. 4 illustrates an example configuration for identifying various audio signal levels and characteristics according to example embodiments. Referring to FIG. 4, the example includes a particular room or environment, such as a conference room with a person 436 estimated to be approximately one meter from a loudspeaker 434. The attenuation values are expressed as gain values. For example, $G_{PS}=L_P-L_{SPKR}$ which is the gain from the loudspeaker at one meter to the person, which may be approximately, for example, −6 dB. $L_P$ is the acoustic sound pressure level without regard to any specific averaging, $L_{SPKR}$ is the sound pressure value 1 meter from the speaker. $G_{MP}$ is the gain from the microphone 432 to the person and $G_{MS}$ is the gain from the microphone to the loudspeaker. A power amplifier 424 may be used to power the microphone and the DSP processor 422 may be used to receive and process data from the microphone to identify the optimal gain and power levels to apply to the speaker 434. Identifying those optimal values would ideally include determining the $G_{PS}$ and the $G_{PS}$. This will assist with achieving a sound level at the listener position as well as a set DSP output gain and input preamp gain values.

In this example of FIG. 4, if a few basic parameters are known about the microphone, the amplifier and the loudspeaker, the $L_{sens,mic,(1)PA}$ (dBu) is the sensitivity of an analog mic in dBu as an absolute quantity relative to 1 Pascal (PA), which in this example is −26.4 dBu, the $G_{amp}$ is the gain of the power amp, which in this example is 29 dB and the $L_{sens,spkr}$, which is the sensitivity of the loudspeaker, which is in this example is 90 dBa. Continuing with this example, the $L_{gen}$ is the level of the signal generator (dBu), $G_{dsp,in}$ is the gain of the DSP processor input including mic preamp gain, in this example 54 dB, $G_{dsp,out}$ is the gain of the DSP processor output gain, in this example −24 dB. A stimulus signal is played and the response signal is measured, which may be, for example 14.4 dBu, and $L_{1PA}=94$. In this example, the sound level at the microphone may be identified by $L_{mic}=L_{dsp}-L_{sens,mic,1PA}+L_{1PA}-G_{dsp,in}=14.4-(-26.4)+94=80.8$ dBa. For 1 meter from the loudspeaker, the sound level is $L_{spkr}=L_{gen}+G_{dsp}+G_{amp}+L_{sens,spkr}-L_{sens,spkr,volts}$=0+(−24 dB)+29 dB+90 dBa−11.3 dBu=83.7 dBu. $G_M$s can now be calculated=$L_{mis}-L_{spkr}$=−2.9 dBa. The estimated values would be based on −2.5 dB per doubling of distance in a typical conference room.

In the event that the gains and other parameters of the mic, power amp and loudspeaker are not known, the measures of $L_P$ and $L_{mic}$ are typically −38 dBu for the mic, with a +/−12 dB, 29 dB+/−3 dB for a power amp and 90 dBa+/−5 dB for a loudspeaker. The above-noted formulas are necessary to compute DSP gains for desired sound levels and to achieve a dynamic range. The desired listener level $L_P$ can then be identified by the various gain measurements.

Figure 5:
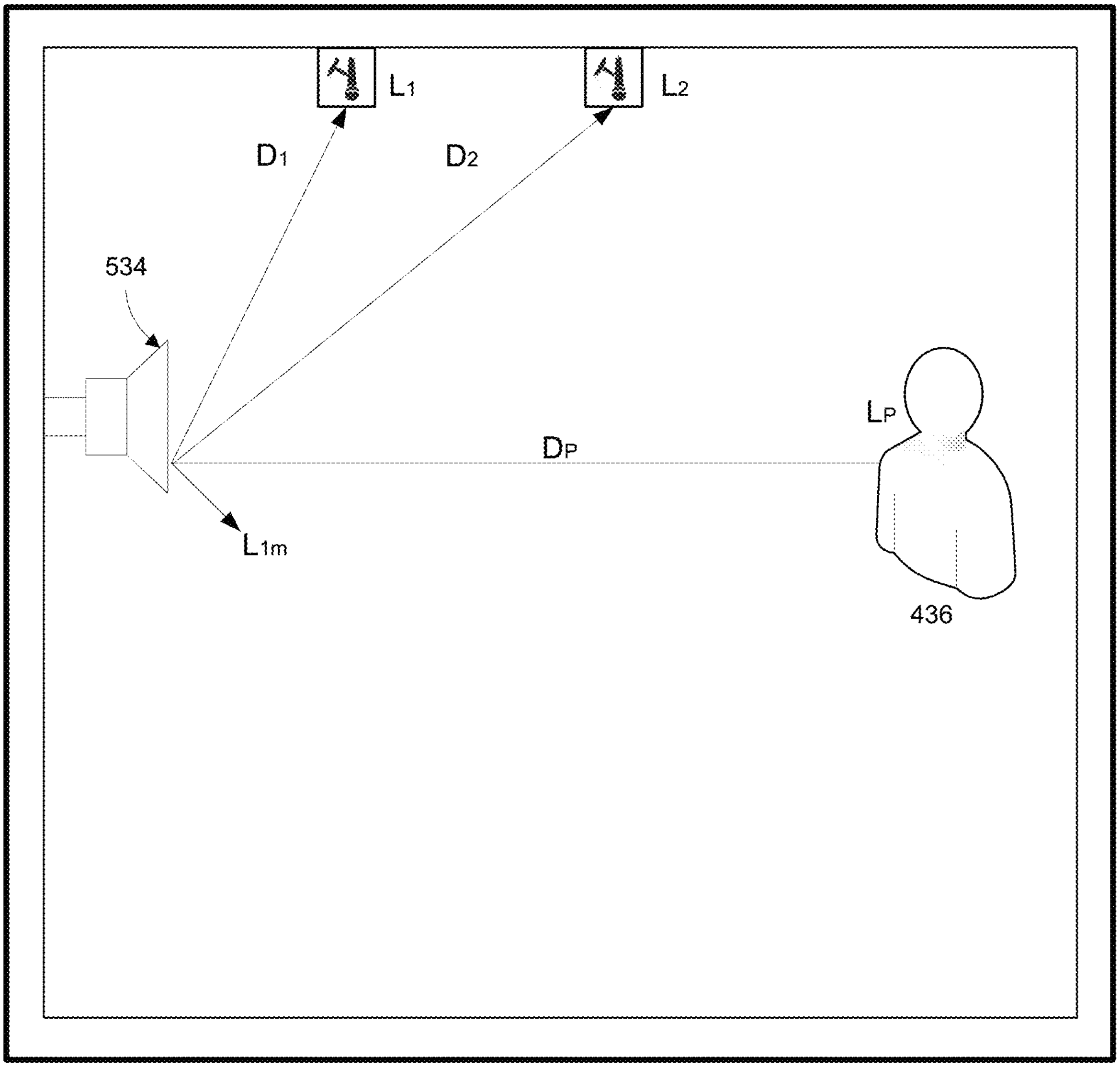
FIG. 5 illustrates an audio configuration used to identify a sound pressure level (SPL) in a controlled speaker and microphone environment according to example embodiments.

FIG. 5 illustrates a process for identifying a sound pressure level (SPL) in the controlled speaker and microphone environment according to example embodiments. Referring to FIG. 5, the example includes a listener 436 in a simulated model being a distance $D_P$ from a speaker 534 in a particular room. The acoustic level attenuation per doubling of distance in free space is 6 dB. However, in rooms this attenuation level will be some value less than 6 dB due to reflections and reverberation. A typical value for acoustic level attenuation in conference rooms is about 3 dB of attenuation per doubling of distance, where generally small and/or reflective rooms will be some quantity less than this, and large and/or absorptive rooms will be greater than this value.

Producing a desired SPL at a specific location using multiple mics at some desired listener level $L_P$ at some distance $D_P$ from a loudspeaker 534, a known level $L_1$ at 1-meter from the loudspeaker 534, and knowing the attenuation per doubling of distance, and the loudspeaker's sensitivity. All of those parameters can be determined from one chirp at two simultaneous measurement locations shown as D1 and D2. The attenuation per doubling of distance can be calculated from any two measurements (at two different locations) in a room assuming the room uniformly attenuates levels. This assumption is more valid as the room size increases, and/or becomes more diffuse. This assumption is also more valid as an average attenuation over all frequencies. The equation for attenuation per doubling of distance can be derived and as: $\alpha_{dd}=-(L_1-L_2)/\log 2(D_2/D_1)$, where L=SPL level, D=distance, and $\alpha_{dd}$ is a negative quantity in this example where attenuation values are considered negative gains. The positions $L_1$ and $L_2$ from the loudspeaker can be any order (i.e., it is not necessary that $D_2>D_1$). Next the loudspeaker sensitivity must be measured, which is the SPL level '1' meter from the speaker when driven by a given reference voltage. If a measurement is made at some distance other than 1 m from the speaker, then that level would be calculated 1 m from the speaker by using aid and the "doublings of distance" relative to 1 m. The doublings of distance from 1 m can be calculated using the expression OneMeterDoublings=log 2($D_1$). Now the level which would occur at 1 m can be calculated using $L_{1m}=L_1-$OneMeterDoublings*αdd. If the electrical test signal used was the speaker's sensitivity electrical reference level, typically 2.83V (1W at 8 ohms), then $L_{1m}=L_{sens,spkr}$. However, if the speaker drive voltage was something different, then $L_{sens,spkr}$ can simply be calculated using the equation $L_{sens,spkr}=L_{1m}-L_{dsp,FSout}-G_{dsp,out}-G_{amp}-G_{attn,out}+L_{sens,skpr,volts}$. $L_{sens,spkr}$ is the sensitivity of the loudspeaker, $L_{dsp,FSout}$ is the sensitivity of the DSP processor output, $G_{dsp,out}$ is the gain of the DSP output, $G_{amp}$ is the gain of the power amp and $G_{atm,out}$ is the gain of any attenuator and $L_{sens,spkr,volts}$ is the sensitivity of the loudspeaker in volts.

Now that a& is identified for the room and the speaker's sensitivity, the speaker drive level (or DSP output gain) necessary to produce a desired level $L_P$ at the listener distance $D_P$ can be determined by calculating the one meter doublings to the listener location using: OneMeterDoublings=log 2($D_1$). Next the listener level can be calculated 1 m from the loudspeaker: $L_{1m}=L_1-$OneMeterDoublings*$\alpha_{dd}$. Finally, the loudspeaker drive level, or DSP output gain, can be identified by: $G_{dsp,out}=L_{1m}-L_{sens,spkr}-L_{dsp,FSout}-G_{amp}-G_{attout}+L_{sens,spkr,volts}$.

In the example of FIG. 5, a room has a loudspeaker on one end and in order to calculate the DSP output gain required to produce a desired SPL level, for example, 72.0 dBSPL at a location 11.92 meters from the loudspeaker. This SPL level is broadband and unweighted, so an unweighted full-range chirp test signal is used. The room happens to have two microphones, but their distances from the loudspeaker are not yet known, and the loudspeaker is not known. The known system parameters are: $I_{dspFsout}$=+20.98 dBu, $G_{dsp,out}$=−20.27 dB (DSP output gain for the chirp measurement), $G_{amp}$=29.64 dB, $G_{attn,out}$=−19.1 dB, and $L_{sens,spkr,volts}$=+11.25 dBu (2.83 V). The procedure is outlined in seven operations, 1) generate a chirp and measure the response at two or more locations. Generating a single chirp and recording the responses from the two mics. The chirp measurement reveals the following data: $L_1$=82.0 $dB_{SPL}$ at 1.89 m from the loudspeaker, $L_2$=73.8 $dB_{SPL}$ at 7.23 m from the loudspeaker, 2) calculate the room attenuation per doubling of distance, Δdd=−(82.0 dB−73.8 dB)/log 2(7.23 m/1.89 m)=−4.24 dB/doubling, 3) calculate the chirp level 1 meter from the speaker by first finding the closest mic's doubling of distance relative to 1 m, OneMeterDoublings=log 2(1.89 m)=0.918 doublings, now calculate the chirp level at 1 m using $L_{1m}$=82.0 $dB_{SPL}$−(0.918 doublings)*(−4.24 dB/doubling)=85.9 $dB_{SPL}$, 4) calculate the loudspeaker's sensitivity, $L_{sens,spkr}$=85.9 $dB_{SPL}$−20.98 dBu−(−20.27 dB)−29.64 dB−(−19.1 dB)+11.25 dBu=85.9 $dB_{SPL}$, 5) calculate the doublings from 1 meter to the listener distance DP, OneMeterDoublings=log 2(11.92 m)=3.575 doublings, 6) calculate the level required at 1 meter from the loudspeaker using L1 m=72 $dB_{SPL}$−(3.575 doublings)*(−4.236 dB/doubling)=87.15 $dB_{SPL}$. Finally, calculate the DSP output gain required to produce this level, $G_{dsp,out}$=87.15 $dB_{SPL}$−85.9 $dB_{SPL}$−20.98 dBu−29.64 dB−(−19.1 dB)+11.25 dBu=−19.01 dB. In this example, the chirp was measured as 72.0 $dB_{SPL}$ at 11.92 meters from the loudspeaker using a DSP output gain of −20.27 dB, so the calculated output gain in this example was off from the actual gain by (20.27−19.01)=1.26 dB.

The procedure calculated a prescribed DSP output gain of −19.0 dB to achieve an SPL level of 72.0 $dB_{SPL}$ at 11.9 meters from the loudspeaker, based on a single chirp measured at 1.89 m and 7.23 m from an unknown loudspeaker, and this calculated gain was in error by 1.26 dB based on the actual measured level at 11.9 m which was positioned outside of the two mic's range. If limited DSP resources only permits measuring the level at one mic at a time in a sequential fashion, then the level difference (L1−L2) must be computed differently. If for each mic, a test signal is increased until a desired SPL level is reached, and then the SPL level and output gain required is recorded, then the dB level difference is: $dB_{diff}=(L1-G_{dBout1})-(L2-G_{dBout2})$. When mic 1 is closer to the speaker than mic 2, then this $dB_{diff}$ will be a positive value. Normally L1 and L2 will be the same, but the closer mic will require a lower output gain to achieve the same SPL level for both mics, so $Gd_{Bout1}$ will be lower, thus giving a positive value for $dB_{diff}$.

In another example, establishing input mic gain levels may include, if the microphones have known input sensitivities, then DSP input gains including analog preamp gains can be set for an optimal dynamic range. For example, if the maximum sound pressure level expected in the room at the microphone locations is 100 dB SPL, then the gain can be set so that 100 dB SPL and this will provide a full-scale value. If the input gains are set too high, then clipping may occur in the preamp or A/D converter. If the input gains are set too low, then weak signals and excessive noise (distorted by automatic gain control (AGC)) will result.

If the microphones do not have known input sensitivities, then chirp response signal levels from loudspeakers closest to each mic input and time-of-flight (TOF) information can be used to estimate the mic sensitivities. The estimate will have errors from unknown off-axis attenuation from the loudspeakers and/or unknown off-axis attenuation of the mics if they do not have an omnidirectional pickup pattern, and other affects due to unknown frequency responses of the mics.

When determining loudspeaker equalization. Ideally each loudspeaker would be equalized to compensate for its frequency response irregularities as well as enhancement of low frequencies by nearby surfaces. If the microphones' frequency responses are known, then each loudspeaker response can be measured via chirp deconvolution after subtracting the microphones' known responses. Furthermore, if the loudspeaker has a known frequency response, then the response of just the room can be determined. The reason for this is because surface reflections in the room can cause comb filtering in the measured response which is not desirable. Comb filtering is a time-domain phenomena and cannot be corrected with frequency-domain filtering. The detection of surface reflections in the impulse response must be considered, so that if major reflections further-out in time can be detected, then they could be windowed-out of the impulse response and therefore removed from the frequency response used to derive the DSP filters.

If the microphones' frequency responses are not known, then frequency response measurements cannot discriminate between irregularities due to the loudspeaker from irregularities due to the mic. If a frequency response of an unknown mic and loudspeaker were made and all the correction was applied to the loudspeaker output path, then deficiencies in the microphone would be over-corrected for the loudspeaker and provide a poor sound for listeners in the far side of a room during an audio presentation from far side speakers. Similarly, if all the correction was applied to the mic input path, then deficiencies in the loudspeaker would be over-corrected for the mic and would yield a poor sound for listeners at the far-end for near side speakers. "Splitting the difference" and applying half of the correction to mic inputs and half to loudspeaker outputs is not a feasible strategy and is unlikely to result in good sound.

Equalization will be applied using standard infinite impulse response (IIR) parametric filters. Finite impulse response (FIR) filters would not be well suited for this application because they have a linear, rather than log or octave frequency resolution, which can require a very high number of taps for low-frequency filters, and are not well suited when the exact listen location(s) are not known. IIR filters are determined by "inverse filtering", such that the inverse of the measured magnitude response is used as a target to "best-fit" a cascade of parametric filters. Practical limits are placed on how much (dB) and how far/wide/narrow (Hz) the auto equalization filters will correct the responses. Frequency response correction by inverse filtering from an impulse response is known to be accurate for a source and listener location. In order to make each loudspeaker sound good at all listening locations, since mic locations are the only know value, then frequency response ensemble averaging will be performed, such that the response from all microphones picked-up by a loudspeaker will be averaged together after some octave smoothing is applied. This procedure will be transparent to the installer because the response from all microphones can be recorded concurrently using a single loudspeaker chirp.

One example may include a microphone equalization procedure, when the microphone frequency response is not known, then equalization of an unknown loudspeaker is not practical and should not be attempted, and therefore the frequency response of the unknown microphone cannot be determined. If, however, the loudspeakers frequency responses are known, then microphone equalization of unknown mics is possible. The process of mic equalization via chirp deconvolution would make use of the loudspeakers' known responses stored in firmware which would be subtracted to arrive at the microphones' responses. The process should be repeated for each loudspeaker so that ensemble averaging can be applied to the measured frequency responses. Each mic's equalizer settings would be determined by inverse filtering methods as described in loudspeaker equalization.

Once loudspeaker and microphone levels have been set and frequency response irregularities have been equalized, then the speaker values and levels can be set based on an RT60 measurements of the room. The reverberation time (RT60) can be obtained by computing a Schroeder reverse integration of the impulse, and the RT60 is a measure of how long sound takes to decay by 60 dB in a space that has a diffuse soundfield, meaning a room large enough that reflections from the source reach the mic from all directions at the same level response energy. Once the RT60 value(s) is known, then NLP levels can be set where generally more aggressive NLP settings are used when reverb tails are longer than the AEC's effective tail length.

Another example may include setting output limiters. If the power amp gains are known and the loudspeaker power ratings are known, then DSP output limiters can be set to protect the loudspeakers. Additionally, if the loudspeaker sensitivities are known, then limiters could further reduce the maximum signal level to protect listeners from excessive sound level. Maintaining gain value information and similar records of power gains/sensitivities is not a feasible option for most administrators. Furthermore, even if the gain values were known, but the speakers were mis-wired/misconfigured, such as in the case of incorrect bridging wiring, then the gain would be incorrect and lead to incorrect power limiting settings. Consequently, SPL limiting is a more desirable operation.

According to additional example embodiments, measuring a speech intelligibility rating (SIR) of a conference room may include measuring a speech transmission index (STI) in a room for one speech source to one listener location. Alternatively, multiple speech sources, for example, ceiling speakers, and multiple listening locations around a room may also be examined to identify an optimal STI and corresponding SIR. Furthermore, the speech source in a conference situation may be located remotely, where the remote microphones, remote room, and transmission channel may all affect the speech intelligibility experience of the listener. In a conference room with multiple loudspeakers, which will normally be used concurrently, the STI should be measured with all "speech conferencing" speakers playing concurrently. Speech conferencing speakers indicates all speakers which would normally be on during a conference, and all speakers which are dedicated to music playback would be turned off. The reason is that the listener will normally be listening to speech coming out of all the speech conferencing speakers concurrently and therefore the speech intelligibility will be affected by all the speakers and hence the rating should be measured with all the speech conferencing speakers active. Compared to a single loudspeaker, the STI measured with all speech conferencing loudspeakers on may be better or worse, depending on the background noise level, the echo and reverberation in the room, the spacing between speakers, etc.

The auto-tune process may use the microphones from the conferencing system and no additional measurement mics, and thus the STI measurement value obtained may be a proxy to the true STI value of a measurement mic placed at a listener's exact ear location. Since the conference room has several listener locations, and may have several conferencing mics, the most optimal STI rating would be obtained by performing measurements at all 'N' mics concurrently, computing 'N' STI values, and then averaging these values to give a single room a single STI value. This would be an average STI value measured at all conferencing mic locations which is a proxy to the average STI value at all listener locations. The auto tune procedure is designed to sequence through each output speaker zone one at a time and measure all mics simultaneously. The real-time STI analyzer task is DSP-intensive and can only measure a single mic input at a time. Therefore, this places practical limits on measuring STI values at 'N' mics and averaging. For the most accurate STI values, all speech conferencing speakers should be played simultaneously. Consequently, certain strategies may be necessary for possibly measuring STI at multiple mics in the auto-tune process.

One strategy may include only measuring the STI during the first speaker iteration although all speakers play the STI signal, and measure using the first mic. Another approach is to measure using the mic determined to be in a middle location as determined by the speaker-to-mic distances measured in the calculation of the IR. Yet another approach is for each speaker zone iteration, measure STI on the next mic input so that multiple STI measurements can be averaged. This approach has drawbacks, such as if there is only one speaker zone, then only the first mic gets measured. If there are fewer speaker zones than mics, then this could miss the middle-located mic, and this approach takes the longest time to operate.

It should also be noted that an STI value is normally understood to represent the speech transmission quality in that room. For remote conferencing systems, the speech transmission quality experienced by a listener has three components: the STI for the loudspeakers and room he/she is sitting in, the STI of the electronic transmission channel, and the STI of the far-end microphones and room. Therefore, the STI value computed by the auto-tune procedure is a proxy for just one of three components which make up the listeners' speech intelligibility experience. However, such information may still be useful as a score can be obtained for the near-end component, of which the user or installer may have control. For example, the user/installer can use the auto-tune STI score to evaluate the relative improvement to the STI from using two different acoustical treatment designs.

An auto equalization algorithm is capable of automatically equalizing the frequency response of any loudspeaker in any room to any desired response shape which can be defined by a flat line and/or parametric curves. The algorithm is not designed to work in real-time during an active program audio event, but rather during a system setup procedure. The algorithm only considers and equalizes the log magnitude frequency response (decibels versus frequency) and does not attempt to equalize phase. The algorithm basically designs a set of optimal filters whose frequency response closely matches the inverse of the measured response in order to flatten it, or reshape it to some other desired response. The algorithm only uses single-biquad IIR filters which are of type bell (boost or cut parametric filter), low-pass, or high-pass. FIR filters could be used, but IIR filters were chosen because of their computational efficiency, better low-frequency resolution, and are better suited for spatial averaging, or equalizing over a broad listening area in a room.

When performing the equalization process, first a desired target frequency response is identified. Typically, this would be a flat response with a low frequency roll-off and high frequency roll-off to avoid the process from designing a filter set which would be attempting to achieve an unachievable result from a frequency-limited loudspeaker. The target mid-band response does not have to be flat, and the process permits any arbitrary target frequency response in the form of an array of biquad filters. The process also permits the user to set maximum dB boost or cut limits on the total DSP filter set to be applied.

Figure 6A:
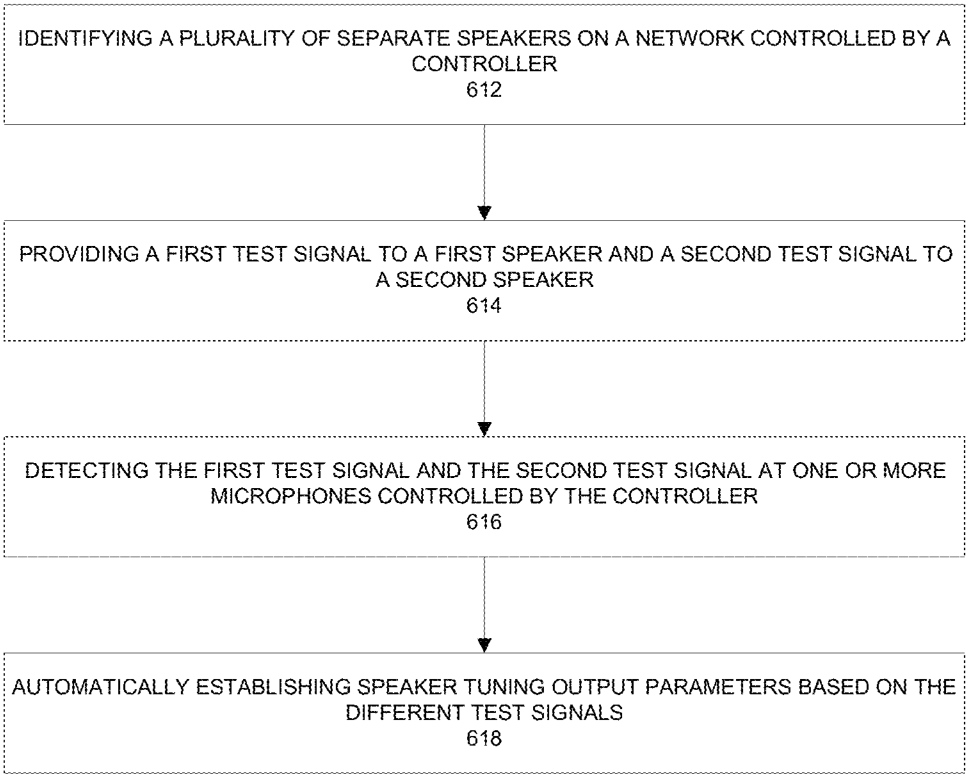
FIG. 6A illustrates a flow diagram of an auto-tune procedure in the controlled speaker and microphone environment according to example embodiments.

FIG. 6A illustrates a process for performing an automated tuning procedure for an audio system. Referring to FIG. 6A, the process may include identifying a plurality of separate speakers on a network controlled by a controller 612, providing a first test signal to a first speaker and a second test signal to a second speaker 614, detecting the first test signal and the second test signal at one or more microphones controlled by the controller, and automatically establishing speaker tuning output parameters based on an analysis of the different test signals 616. The tuning parameters may be applied to a digital DSP set of parameters which are applied to the various speakers and microphones in the audio environment.

The first test signal may be a different frequency than the second test signal. The first test signal may be provided at a first time and the second test signal may be provided at a second time later than the first time. The process may also include automatically establishing speaker tuning output parameters based on an analysis of the different test signals by measuring an ambient noise level via the one or more microphones, and determining an impulse response based on the first test signal and the second test signal, and determining a speaker output level to use for the first and second speakers based on the impulse response and the ambient noise level. The process may also include determining a frequency response based on an output of the first and second speakers, averaging values associated with the first test signal the second test signal to obtain one or more of an average sound pressure level (SPL) for the one or more microphones, an average distance from all the one or more microphones and an average frequency response as measured from the one or more microphones. The process may also include initiating a verification procedure as an iterative procedure that continues for each of the first speaker and the second speaker. The process may also include performing an automated equalization procedure to identify a frequency response of the first and second speakers to a desired response shape, and identifying one or more optimal filters having a frequency response that closely matches the inverse of the measured frequency response.

Figure 6B:
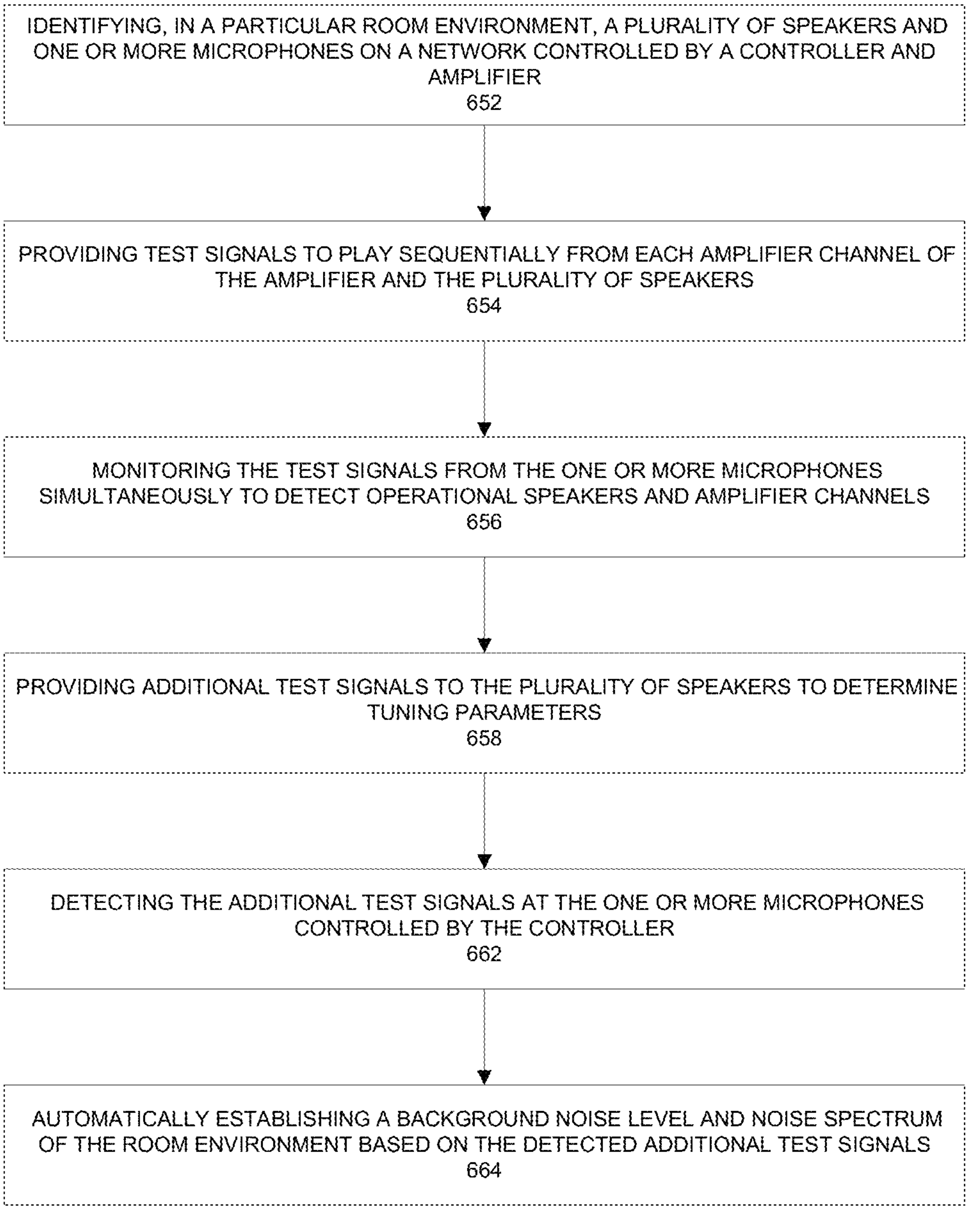
FIG. 6B illustrates a flow diagram of another auto-tune procedure in the controlled speaker and microphone environment according to example embodiments.

FIG. 6B illustrates a process for performing an automated tuning procedure for an audio system. Referring to FIG. 6B, the process may include identifying, in a particular room environment, a plurality of speakers and one or more microphones on a network controlled by a controller 652, providing test signals to play sequentially from each amplifier channel and the plurality of speakers 654, monitoring the test signals from the one or more microphones simultaneously to detect operational speakers and amplifier channels 656, providing additional test signals to the plurality of speakers to determine tuning parameters 658, detecting the additional test signals at the one or more microphones controlled by the controller 662, and automatically establishing a background noise level and noise spectrum of the room environment based on the detected additional test signals 664.

The process may also include monitoring the test signals from the one or more microphones simultaneously identifies whether any amplifier output channels are unconnected to the plurality of speakers. The additional test signals may include a first test signal being provided at a first time and a second test signal being provided at a second time later than the first time. The process may also include automatically establishing a frequency response of each of the plurality of speakers, and a sensitivity level of each amplifier channel and corresponding speaker. The sensitivity level is based on a target sound pressure level (SPL) of the particular room environment. The process may also include identifying a distance from each of the one or more microphones to each of the plurality of speakers, a room reverberation time of the particular room environment, a per-speaker channel level setting to achieve the target SPL, a per-speaker channel equalization setting to normalize each speaker's frequency response and to achieve a target room frequency response, an acoustic echo cancellation parameter that is optimal for the particular room environment, a noise reduction parameter that is optimal to reduce background noise detected by the microphones for the particular room environment, and a non-linear processing parameter that is optimal to reduce background noise when no voice is detected for the particular room environment. The process may also include initiating a verification procedure as an iterative procedure that continues for each of the plurality of speakers, and the verification procedure comprises again detecting the additional test signals at the one or more microphones controlled by the controller to verify the target SPL and the target room frequency response.

Figure 7:
FIG. 7 illustrates another flow diagram of an auto-configuration procedure in the controlled speaker and microphone environment according to example embodiments.

FIG. 7 illustrates an example process for performing an automated audio system setup configuration. Referring to FIG. 7, the process may include identifying a plurality of speakers and microphones connected to a network controlled by a controller 712, assigning a preliminary output gain to the plurality of speakers used to apply test signals 714, measuring ambient noise detected from the microphones 716, recording chirp responses from all microphones simultaneously 718, deconvolving all chirp responses to determine a corresponding number of impulse responses 722, and measuring average sound pressure levels (SPLs) of each of the microphones to obtain a SPL level based on an average of the SPLs 724.

The measuring ambient noise detected from the microphones may include checking for excessive noise. For each microphone input signal, the process may include identifying a main impulse peak, and identifying a distance from one or more of the plurality of speakers to each microphone. The process may include determining frequency responses of each microphone input signal, and applying a compensation value to each microphone based on the frequency response. The process may also include averaging the frequency responses to obtain a spatial average response, and performing an automated equalization of the spatial average response to match a target response value. The process may further include determining an attenuation value associated with the room based on the SPL level and a distance from nearest and furthest microphones, and determining an output gain that provides a target sound level at an average distance of all microphones based on the SPL level and attenuation value.

Figure 8:
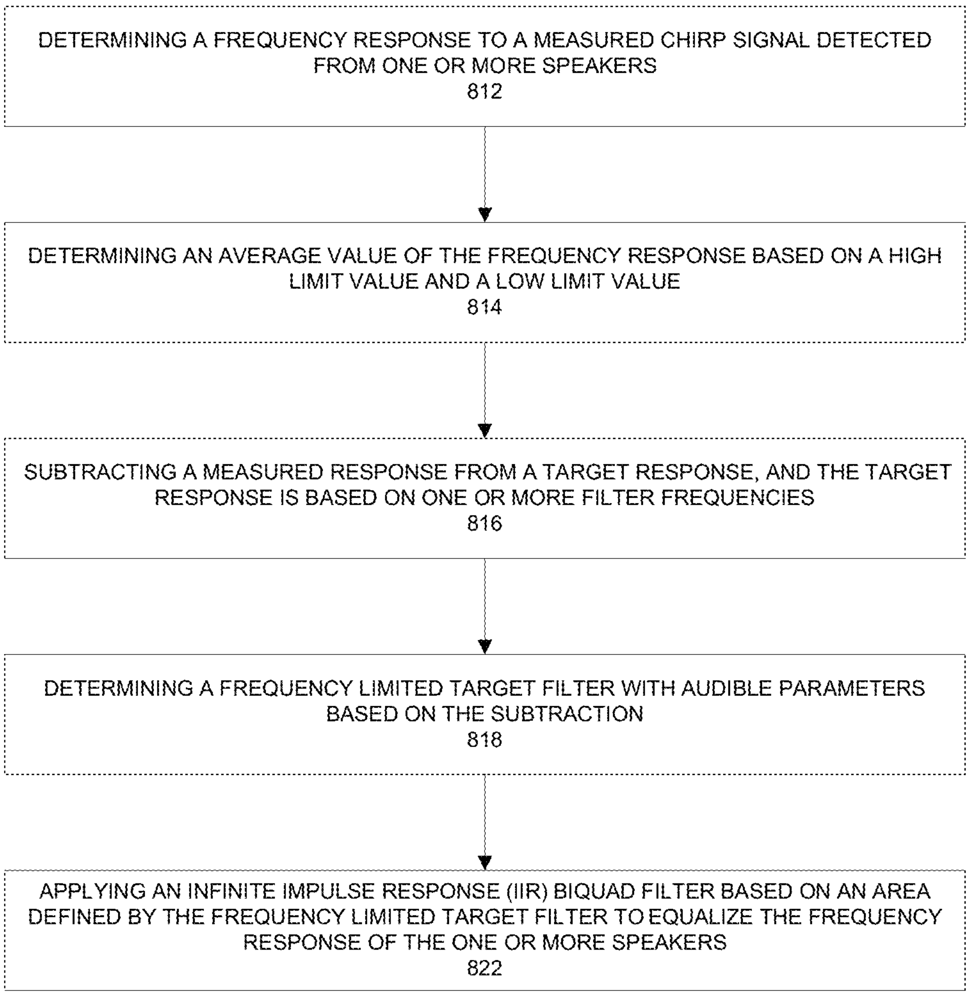
FIG. 8 illustrates a flow diagram of an auto-equalization procedure in the controlled speaker and microphone environment according to example embodiments.

FIG. 8 illustrates an example process for performing an auto-equalization procedure to an audio system. Referring to FIG. 8, the process may include determining a frequency response to a measured chirp signal detected from one or more speakers 812, determining an average value of the frequency response based on a high limit value and a low limit value 814, subtracting a measured response from a target response, wherein the target response is based on one or more filter frequencies 816, determining a frequency limited target filter with audible parameters based on the subtraction 818, and applying an infinite impulse response (IR) biquad filter based on an area defined by the frequency limited target filter to equalize the frequency response of the one or more speakers 822.

The average value is set to zero decibels, and the target response is based on one or more frequencies associated with one or more biquad filters. The determining the target filter based on the target response may include determining target zero crossings and target filter derivative zeros. The process may also include limiting decibels of the target filter based on detected amplitude peaks to create a limited filter, and adding the limited filter to a filter set. The process may also include adding unlimited equalization filters to a measured response to provide an unlimited corrected response. The process may further include subtracting the unlimited corrected response from the target response to provide a new target filter.

Figure 9:
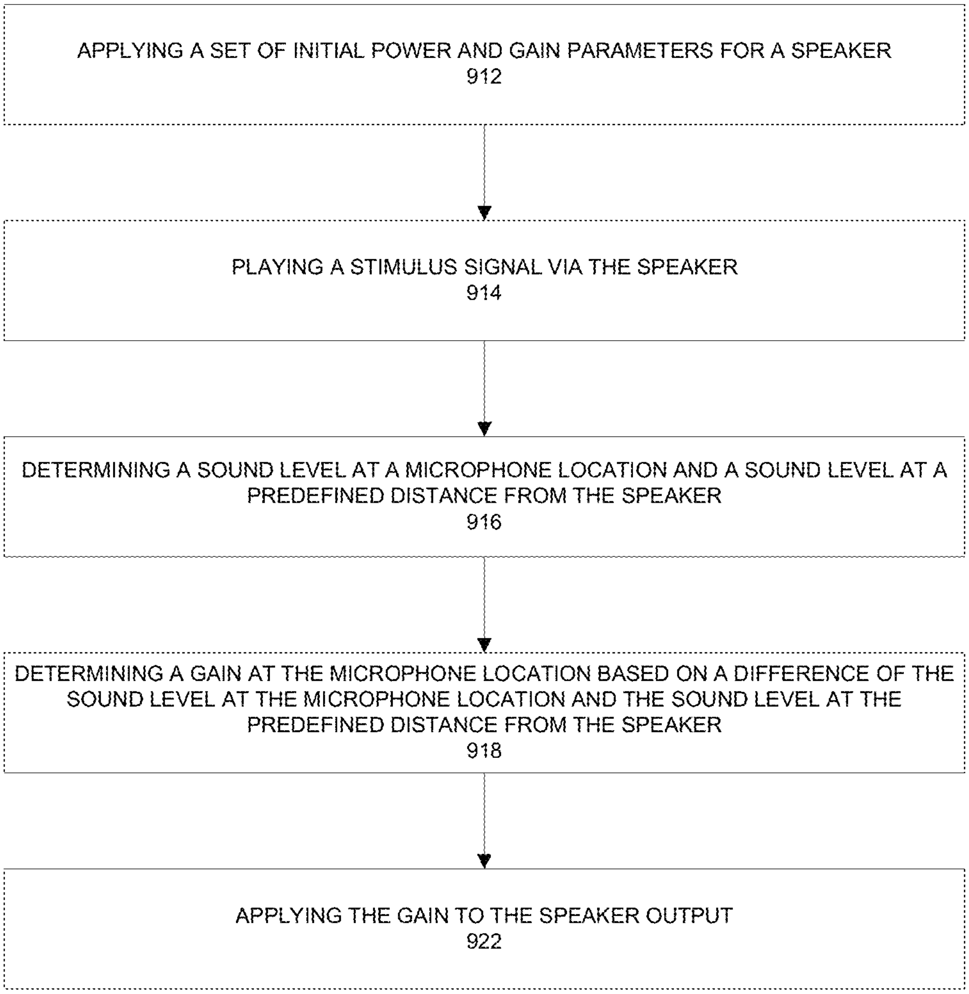
FIG. 9 illustrates a flow diagram of an automated gain identification procedure in the controlled speaker and microphone environment according to example embodiments.

FIG. 9 illustrates an example process for determining one or more gain values to apply to an audio system. Referring to FIG. 9, the process may include applying a set of initial power and gain parameters for a speaker 912, playing a stimulus signal via the speaker 914, measuring a frequency response signal of the played stimulus 916, determining a sound level at a microphone location and a sound level at a predefined distance from the one or more of speakers 918, determining a gain at the microphone location based on a difference of the sound level at the microphone location and the sound level at the predefined distance from the speaker 922, and applying the gain to the speaker output 924.

The predefined distance may be a set distance associated with where a user would likely be with respect to a location of the speaker, such as one meter. The process may also include detecting the stimulus signal at the microphone a first distance away from the speaker and at a second microphone a second distance, further than the first distance, from the speaker, and the detecting is performed at both microphones simultaneously. The process may further include determining a first sound pressure level at the first distance and a second sound pressure level at the second distance. The process may also include determining an attenuation of the speaker based on a difference of the first sound pressure level and the second sound pressure level. The process may further include determining a sensitivity of the speaker based on a sound pressure level measured at a predefined distance from the speaker when the speaker is driven by a reference voltage.

Figure 10:
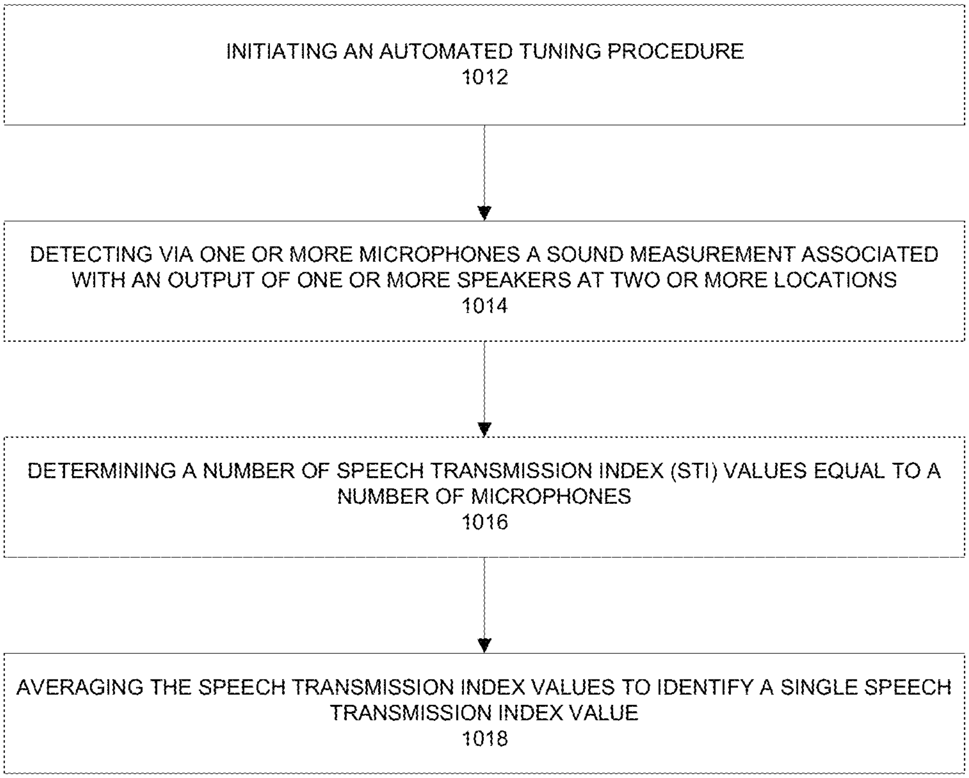
FIG. 10 illustrates a flow diagram of an automated speech intelligibility determination procedure in the controlled speaker and microphone environment according to example embodiments.

FIG. 10 illustrates a process for identifying a speech intelligibility rating or speech transmission index. Referring to FIG. 10, the process may include initiating an automated tuning procedure 1012, detecting via the one or more microphones a sound measurement associated with an output of a plurality of speakers at two or more locations 1014, determining a number of speech transmission index (STI) values equal to a number of microphones 1016, and averaging the speech transmission index values to identify a single speech transmission index value 1018.

The process may also include measuring the number of STIs values while a plurality of speakers are concurrently providing output signals. The measuring the number of STIs values while a plurality of speakers are concurrently providing output signals may include using one microphone. The measuring the number of STIs values while a plurality of speakers are concurrently providing output signals may include using one microphone among a plurality of microphones and the one microphone is identified as being closest to a middle location among locations of the plurality of speakers. The averaging the speech transmission index values to identify a single speech transmission index value may include measuring the STI values at 'N' microphones, and 'N' is greater than one, and averaging the 'N' values to identify a single STI value for a particular environment.

The automated tuning may automatically measure the speech intelligibility of the conferencing audio system and the corresponding room, using only the components normally needed by the conferencing system, and no other instrumentation. The automated tuning may be used with 3rd-party power amplifiers and loudspeakers. Since the gain and sensitivity of these components are unknown, the auto tune process rapidly determines these parameters using a unique broad-band multitone ramp-up signal until it has reached a known SPL level at the microphones, along with speaker-to-microphone distances measured automatically via acoustic latency and calculated using the speed of sound. Using this technique, auto tune can determine the gain and sensitivity of the corresponding components, and the SPL level from the loudspeaker. Ramping up a broadband multitone signal rapidly, and for the automatic determination of the system parameters provides optimization. The auto tune auto-equalization algorithm rapidly equalizes multiple speaker zones, based on the various filters. Also, additional enhancements are added to that algorithm.

The process may include analyzing an electro-acoustic sound system in terms of levels and gains to determine gains required to achieve desired acoustic levels, as well as to optimize the gain structure for maximum dynamic range. Sound pressure level is historically expressed in "dB SPL". Sound levels are often expressed with units of "dB" where it is implied that it is actually an absolute level relative to 0 dB=20 u Pascal. Modern international standards express sound pressure level as Lp/(20 uPa) or shortened to Lp. However Lp is also commonly used to denote a variable in sound level rather than the unit of sound level. To avoid any confusion, in this analysis the sound pressure level will always be expressed as "dBa" meaning absolute acoustic level and is the same thing as the outdated "dB SPL". "dBa" should not be confused with "dBA" which often is the units expressed for A-weighted sound levels. In this analysis, 'L' is always a level variable which is an absolute quantity, and 'G' is always a gain variable which is a relative quantity. Since the equations contain variables having different units (electrical versus acoustical), while still being in decibels, the units are shown explicitly in { } for clarity.

The analysis is broken into two distinctly different signal paths, the input path from an acoustic source (talker 218) to the DSP internal processing, and the path from the DSP internal processing to the acoustic level output from the loudspeaker. These two paths then each have two variations. The input signal path has an analog versus digital mic variation, and the output path has an analog versus digital power amp variation (digital in terms of its input signal, not its power amplification technology). For the sake of consistency and simplicity, all signal attenuations are expressed as a gain which would have a negative value. For example, GP-S=LP−LSpkr is the gain from the loudspeaker (@ 1 meter) to the person, and this value might be something like −6 dB. These gains are shown as direct arrows in the illustration, but in reality the sound path consists of surface reflections and diffuse sound from around the room. Clearly the impulse response of the room would reveal details of the room behavior, but in this analysis we are only concerned with non-temporal steady-state sound levels, for example resulting from pink noise. For simplicity in this analysis these multiple sound paths are all lumped into a single path with gain 'G'. By measuring GP-S and GM-P, a known sound level at the listener position can be identified, as well as a set DSP output gain and input preamp gains. Since there is no measurement microphones at the listener position, GP-S and GM-P are estimates. However, we can accurately measure GM-S and make some estimates of GP-S and GM-P based on typical conference room acoustics "rules-of-thumb". For the sake of consistency and simplicity, all signal attenuations are expressed as a gain which would have a negative value. For example, GP-S=LP−LSpkr is the gain from the loudspeaker (@ 1 meter) to the person, and this value might be something like −6 dB. These gains are shown as direct arrows in the illustration, but in reality the sound path consists of surface reflections and diffuse sound from around the room. Clearly the impulse response of the room would reveal details of the room behavior, but in this analysis the non-temporal steady-state sound levels are identified, for example resulting from pink noise. For simplicity in this analysis the multiple sound paths are all lumped into a single path with gain G. GP-S and GM-P are measured so a known sound level at the listener position can be identified, as well as set DSP output gain and input preamp gains optimally.

The automated tuning may automatically measure the speech intelligibility of the conferencing audio system and the corresponding room, using only the components normally needed by the conferencing system, and no other instrumentation. The automated tuning may be used with 3rd-party power amplifiers and loudspeakers. Since the gain and sensitivity of these components are unknown, the auto tune process rapidly determines these parameters using a unique broad-band multitone ramp-up signal until it has reached a known SPL level at the microphones, along with speaker-to-microphone distances measured automatically via acoustic latency and calculated using the speed of sound. Using this technique, auto tune can determine the gain and sensitivity of the corresponding components, and the SPL level from the loudspeaker. Ramping up a broadband multitone signal rapidly, and for the automatic determination of the system parameters provides optimization. The auto tune auto-equalization algorithm rapidly equalizes multiple speaker zones, based on the various filters. Also, additional enhancements are added to that algorithm.

One example embodiment may include measuring speech intelligibility to reasonably obtain a speech intelligibility rating for a conference room. The speech transmission index (STI) should be identified with respect to multiple speech sources (for example ceiling speakers), and multiple listening locations around the room. Furthermore, the speech source in a conference situation may be located remotely, where the remote microphones, remote room, and transmission channel may all affect the speech intelligibility experience of the listener. In a conference room with multiple loudspeakers which will normally be used concurrently, the STI logically should be measured with all "speech conferencing" speakers playing concurrently. Speech conferencing speakers means all speakers which would normally be on during a conference, and all speakers which are dedicated to music playback would be turned off. The reason is that the listener will normally be listening to speech coming out of all the speech conferencing speakers concurrently and therefore the speech intelligibility will be affected by all the speakers and hence the rating should be measured with all the speech conferencing speakers turned on. Compared to a single loudspeaker, the STI measured with all speech conferencing loudspeakers on may be better or worse, depending on the background noise level, the echo and reverberation in the room, the spacing between speakers etc.

Since auto tune must use the microphones from the conferencing system and not additional measurement mics, then it should be noted that the STI measurement value from Auto Tune is a proxy to the true STI value of a measurement mic placed at a listener's ear location. Since the conference room has several listener locations, and may have several conferencing mics, the best STI rating would be obtained by measuring at all N mics concurrently, compute N STI values, and then average these values to give a single room STI value. This would be an average STI value measured at all conferencing microphone locations which would in turn be a proxy to the average STI value at all listener locations. The auto tune algorithm(s) are designed to sequence through each output speaker zone one at a time and measures all microphones simultaneously. Furthermore, the real-time STI analyzer task is very DSP-intensive and can only measure a single microphone input at a time. Therefore, this places practical limits on measuring STI values at 'N' microphones and averaging the values. For the most accurate STI values, all speech conferencing speakers should be played simultaneously.

A few strategies for possibly measuring STI at multiple microphones in an auto tune procedure may include, as a first approach, only measuring STI during the first speaker iteration but all speakers will play the STIPA, and then the measurement is performed using the first microphone but measurements using the microphone are determined to be in a middle location as determined by the speaker-to-microphone distances measured in the CalcIR state. Another approach may include, for each speaker zone iteration, measuring an STI on the next microphone input so that multiple STI measurements can be averaged. However, certain concerns may be if there is only one speaker zone, then only the first microphone will be measured. If there are fewer speaker zones than microphones, then the middle-located microphone could be missed and this approach takes the longest to run.

It should also be noted that an STI value is normally understood to represent the speech transmission quality in that room. For remote conferencing systems, the speech transmission quality experienced by a listener actually has three components the STI for the loudspeakers and room a person is sitting in, the STI of the electronic transmission channel and the STI of the far-end microphones and room. Therefore, the STI value computed by auto-tune is a proxy for just one of three components which make up the listeners speech intelligibility experience. However, this may still provide a score for the near-end component, which the user or installer may have control of during the event. For example, the user/installer can use the auto tune STI score to evaluate the relative improvement to STI from using two different acoustical treatment designs.

The automated tuning may automatically measure the speech intelligibility of the conferencing audio system and the corresponding room, using only the components normally needed by the conferencing system, and no other instrumentation. The automated tuning may be used with 3rd-party power amplifiers and loudspeakers. Since the gain and sensitivity of these components are unknown, the auto tune process rapidly determines these parameters using a unique broad-band multitone ramp-up signal until it has reached a known SPL level at the microphones, along with speaker-to-microphone distances measured automatically via acoustic latency and calculated using the speed of sound. Using this technique, auto tune can determine the gain and sensitivity of the corresponding components, and the SPL level from the loudspeaker. Ramping up a broadband multitone signal rapidly, and for the automatic determination of the system parameters provides optimization. The auto tune auto-equalization algorithm rapidly equalizes multiple speaker zones, based on the various filters. Also, additional enhancements are added to that algorithm.

The operations of a method or algorithm described in connection with the embodiments disclosed herein may be embodied directly in hardware, in a computer program executed by a processor, or in a combination of the two. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

Figure 11:
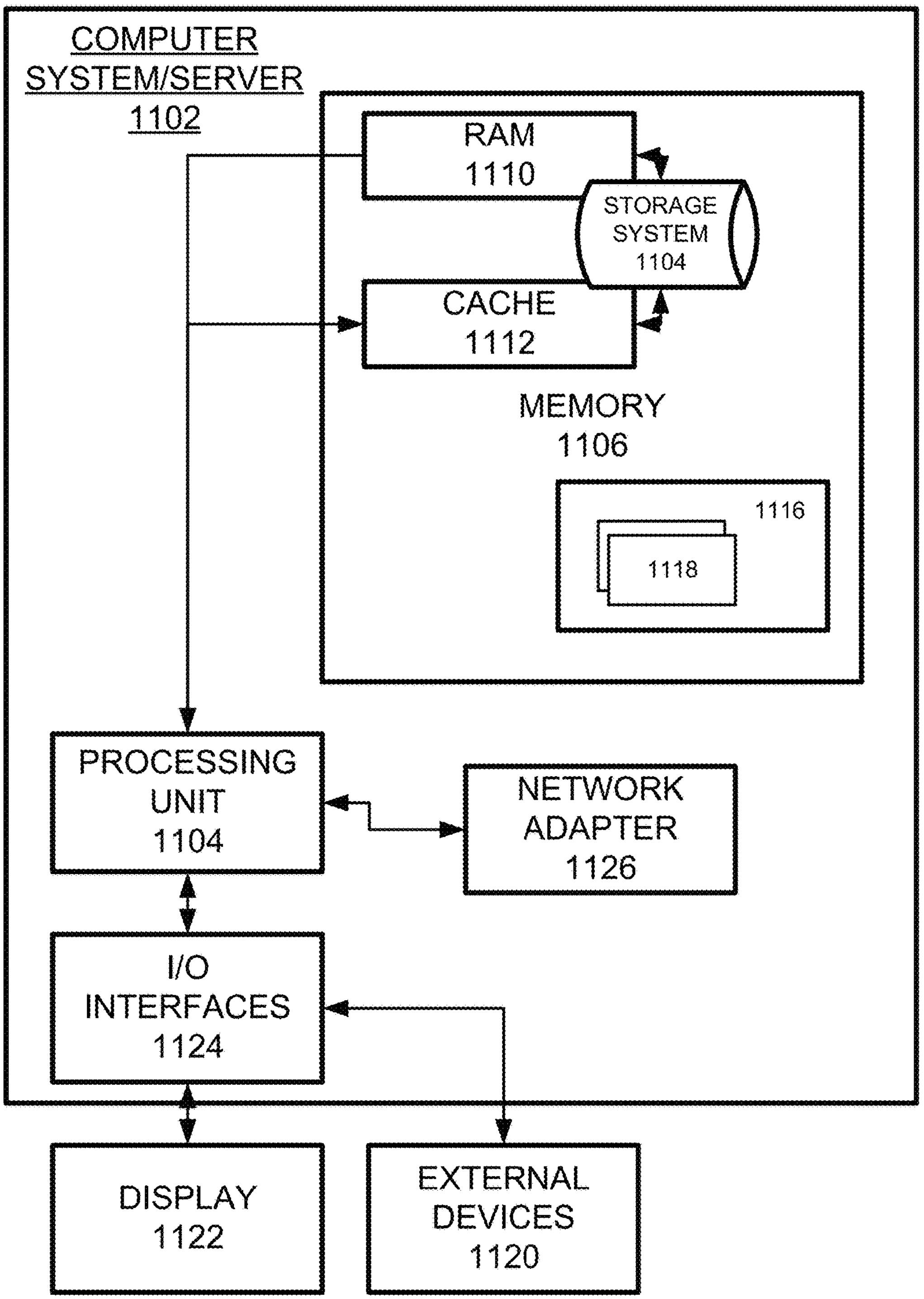
FIG. 11 illustrates a system configuration for storing and executing the automatic tuning procedure.

FIG. 11 is not intended to suggest any limitation as to the scope of use or functionality of embodiments of the application described herein. Regardless, the computing node 1100 is capable of being implemented and/or performing any of the functionality set forth hereinabove.

In computing node 1100 there is a computer system/server 1102, which is operational with numerous other general purpose or special purpose computing system environments or configurations. Examples of well-known computing systems, environments, and/or configurations that may be suitable for use with computer system/server 1102 include, but are not limited to, personal computer systems, server computer systems, thin clients, rich clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1102 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 1102 may be practiced in distributed cloud computing environments where tasks are performed by remote processing devices that are linked through a communications network. In a distributed cloud computing environment, program modules may be located in both local and remote computer system storage media including memory storage devices.

As displayed in FIG. 11, computer system/server 1102 in cloud computing node 1100 is displayed in the form of a general-purpose computing device. The components of computer system/server 1102 may include, but are not limited to, one or more processors or processing units 1104, a system memory 1106, and a bus that couples various system components including system memory 1106 to processor 1104.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1102 typically includes a variety of computer system readable media. Such media may be any available media that is accessible by computer system/server 1102, and it includes both volatile and non-volatile media, removable and non-removable media. System memory 1106, in one embodiment, implements the flow diagrams of the other figures. The system memory 1106 can include computer system readable media in the form of volatile memory, such as random-access memory (RAM) 1110 and/or cache memory 1112. Computer system/server 1102 may further include other removable/non-removable, volatile/non-volatile computer system storage media. By way of example only, storage system 1114 can be provided for reading from and writing to a non-removable, non-volatile magnetic media (not displayed and typically called a "hard drive"). Although not displayed, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory 1106 may include at least one program product having a set (e.g., at least one) of program modules that are configured to carry out the functions of various embodiments of the application.

Program/utility 1116, having a set (at least one) of program modules 1118, may be stored in memory 1106 by way of example, and not limitation, as well as an operating system, one or more application programs, other program modules, and program data. Each of the operating system, one or more application programs, other program modules, and program data or some combination thereof, may include an implementation of a networking environment. Program modules 1118 generally carry out the functions and/or methodologies of various embodiments of the application as described herein.

As will be appreciated by one skilled in the art, aspects of the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in one or more computer readable medium(s) having computer readable program code embodied thereon.

Computer system/server 1102 may also communicate with one or more external devices 1120 such as a keyboard, a pointing device, a display 1122, etc.; one or more devices that enable a user to interact with computer system/server 1102; and/or any devices (e.g., network card, modem, etc.) that enable computer system/server 1102 to communicate with one or more other computing devices. Such communication can occur via I/O interfaces 1124. Still yet, computer system/server 1102 can communicate with one or more networks such as a local area network (LAN), a general wide area network (WAN), and/or a public network (e.g., the Internet) via network adapter 1126. As depicted, network adapter 1126 communicates with the other components of computer system/server 1102 via a bus. It should be understood that although not displayed, other hardware and/or software components could be used in conjunction with computer system/server 1102. Examples include, but are not limited to: microcode, device drivers, redundant processing units, external disk drive arrays, RAID systems, tape drives, and data archival storage systems, etc.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present application in any way but is intended to provide one example of many embodiments. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network.

It will be readily understood that the components of the application, as generally described and illustrated in the figures herein, may be arranged and designed in a wide variety of different configurations. Thus, the detailed description of the embodiments is not intended to limit the scope of the application as claimed but is merely representative of selected embodiments of the application.

One having ordinary skill in the art will readily understand that the above may be practiced with steps in a different order, and/or with hardware elements in configurations that are different than those which are disclosed. Therefore, although the application has been described based upon these preferred embodiments, it would be apparent to those of skill in the art that certain modifications, variations, and alternative constructions would be apparent.

While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed is:

1. A method, comprising:

identifying, in a room environment, a plurality of speakers, one or more microphones, and an amplifier that are controlled by a controller;

automatically generating information regarding a frequency response of each microphone of the one or more microphones based on a plurality of speaker outputs;

automatically establishing a background noise level and noise spectrum of the room environment based on additional test signals and the information regarding the frequency response of each microphone; and automatically calculating tuning parameters for each speaker of the plurality of speakers based on the background noise level and the noise spectrum.

2. The method of claim 1, comprising:

generating a plurality of additional speaker outputs based on the additional test signals, wherein the additional test signals comprise a first test signal provided at a first time and a second test signal provided at a second time later than the first time.

3. The method of claim 1, comprising:

simultaneously monitoring a speaker output by the one or more microphones to detect operational speakers and operational amplifier channels.

4. The method of claim 1, comprising:

establishing the frequency response for each speaker of the plurality of speakers; and establishing a sensitivity level of each channel of the amplifier and a corresponding speaker of the plurality of speakers.

5. The method of claim 4, wherein the sensitivity level is based on a target sound pressure level (SPL) of the room environment.

6. The method of claim 5, comprising identifying:

a distance from each of the one or more microphones to each speaker of the plurality of speakers;

a room reverberation time of the room environment;

a per-speaker channel level setting to achieve the target SPL;

a per-speaker channel equalization setting to normalize each speaker's frequency response and to achieve a target room frequency response;

an acoustic echo cancellation parameter that is optimal for the room environment;

a noise reduction parameter that is optimal to reduce background noise detected by the one or more microphones for the room environment; and a non-linear processing parameter that is optimal to reduce background noise when no voice is detected in the room environment.

7. The method of claim 6, comprising:

initiating a verification procedure as an iterative procedure that continues for each speaker of the plurality of speakers, wherein the verification procedure comprises detecting additional test signals at the one or more microphones controlled by the controller to verify the target SPL and the target room frequency response.

8. An apparatus comprising:

a processor configured to:

identify, in a room environment, a plurality of speakers, one or more microphones, and an amplifier that are controlled by a controller;

automatically generate information regarding a frequency response of each microphone of the one or more microphones based on a plurality of speaker outputs;

automatically establish a background noise level and noise spectrum of the room environment based on additional test signals and the information regarding the frequency response of each microphone; and automatically calculate tuning parameters for each speaker of the plurality of speakers based on the background noise level and the noise spectrum.

9. The apparatus of claim 8, wherein the processor is configured to:

generate a plurality of additional speaker outputs based on the additional test signals, wherein the additional test signals comprise a first test signal provided at a first time and a second test signal provided at a second time later than the first time sequentially output a test signal from each channel of the amplifier channel to a corresponding speaker of the plurality of speakers to generate a speaker output.

10. The apparatus of claim 8, wherein the processor is configured to:

simultaneously monitor a speaker output by the one or more microphones to detect operational speakers and operational amplifier channels.

11. The apparatus of claim 8, wherein the processor is configured to:

establish the frequency response for each speaker of the plurality of speakers and a sensitivity level of each channel of the amplifier; and establish a corresponding speaker of the plurality of speakers.

12. The apparatus of claim 11, wherein the sensitivity level is based on a target sound pressure level (SPL) of the room environment.

13. The apparatus of claim 12, wherein the processor is configured to identify:

a distance from each of the one or more microphones to each speaker of the plurality of speakers;

a room reverberation time of the room environment;

a per-speaker channel level setting to achieve the target SPL;

a per-speaker channel equalization setting to normalize each speaker's frequency response and to achieve a target room frequency response;

an acoustic echo cancellation parameter that is optimal for the room environment;

a noise reduction parameter that is optimal to reduce background noise detected by the one or more microphones for the room environment; and a non-linear processing parameter that is optimal to reduce background noise when no voice is detected in the room environment.

14. The apparatus of claim 13, wherein the processor is configured to:

initiate a verification procedure as an iterative procedure that continues for each speaker of the plurality of speakers, wherein the verification procedure comprises to detect additional test signals at the one or more microphones controlled by the controller to verify the target SPL and the target room frequency response.

15. A non-transitory computer-readable storage medium configured to store one or more instructions that, when executed by a processor, cause the processor to perform:

identifying, in a room environment, a plurality of speakers, one or more microphones, and an amplifier that are controlled by a controller;

automatically generating information regarding a frequency response of each microphone of the one or more microphones based on a plurality of speaker outputs;

automatically establishing a background noise level and noise spectrum of the room environment based on additional test signals and the information regarding the frequency response of each microphone; and automatically calculating tuning parameters for each speaker of the plurality of speakers based on the background noise level and the noise spectrum.

16. The non-transitory computer-readable storage medium of claim 15, wherein the one or more instructions cause the processor to perform:

generating a plurality of additional speaker outputs based on the additional test signals, wherein the additional test signals comprise a first test signal provided at a first time and a second test signal provided at a second time later than the first time.

17. The non-transitory computer-readable storage medium of claim 15, wherein the one or more instructions cause the processor to perform:

simultaneously monitoring a speaker output by the one or more microphones to detect operational speakers and operational amplifier channels.

18. The non-transitory computer-readable storage medium of claim 15, wherein the one or more instructions cause the processor to perform:

establishing the frequency response for each speaker of the plurality of speakers; and establishing a sensitivity level of each channel of the amplifier and a corresponding speaker of the plurality of speakers.

19. The non-transitory computer-readable storage medium of claim 18, wherein the sensitivity level is based on a target sound pressure level (SPL) of the room environment.

20. The non-transitory computer-readable storage medium of claim 19, wherein the one or more instructions cause the processor to perform identifying:

a distance from each of the one or more microphones to each speaker of the plurality of speakers;

a room reverberation time of the room environment;

a per-speaker channel level setting to achieve the target SPL;

a per-speaker channel equalization setting to normalize each speaker's frequency response and to achieve a target room frequency response;

an acoustic echo cancellation parameter that is optimal for the room environment;

a noise reduction parameter that is optimal to reduce background noise detected by the one or more microphones for the room environment; and a non-linear processing parameter that is optimal to reduce background noise when no voice is detected in the room environment.

* * * * *